US012760446B2

(12) United States Patent
Iso et al.

(10) Patent No.: US 12,760,446 B2
(45) Date of Patent: *Oct. 13, 2026

(54) n-TYPE GaN CRYSTAL, GaN WAFER, AND GaN CRYSTAL, GaN WAFER AND NITRIDE SEMICONDUCTOR DEVICE PRODUCTION METHOD

(71) Applicant: MITSUBISHI CHEMICAL CORPORATION, Tokyo (JP)

(72) Inventors: Kenji Iso, Tokyo (JP); Tatsuya Takahashi, Tokyo (JP); Tae Mochizuki, Tokyo (JP); Yuuki Enatsu, Tokyo (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 19/225,168

(22) Filed: Jun. 2, 2025

(65) Prior Publication Data

US 2025/0290228 A1 Sep. 18, 2025

Related U.S. Application Data

(63) Continuation of application No. 18/623,278, filed on Apr. 1, 2024, now Pat. No. 12,351,943, which is a (Continued)

(30) Foreign Application Priority Data

Aug. 17, 2018 (JP) ................................ 2018-153432
Mar. 27, 2019 (JP) ................................ 2019-059630
Apr. 22, 2019 (JP) ................................ 2019-080810

(51) Int. Cl.
*B32B 3/00* (2006.01)
*B32B 5/14* (2006.01)

(Continued)

(52) U.S. Cl.
CPC .............. *C30B 29/406* (2013.01); *B32B 3/00* (2013.01); *B32B 5/14* (2013.01); *C23C 16/34* (2013.01);

(Continued)

(58) Field of Classification Search
CPC .... B32B 3/00; B32B 3/26; B32B 5/14; C30B 25/02
See application file for complete search history.

(56) References Cited

U.S. PATENT DOCUMENTS 11,987,903 B2 * 5/2024 Iso ........................ C30B 29/406
12,351,943 B2 * 7/2025 Iso ........................ C30B 29/406

(Continued)

FOREIGN PATENT DOCUMENTS

CN 101442030 A 5/2009
EP 2065491 A2 6/2009

(Continued)

OTHER PUBLICATIONS

Office Action issued Oct. 28, 2025, in corresponding Japanese Patent Application No. 2024-153026 (with machine English translation), 8 pages.

(Continued)

*Primary Examiner* — Elizabeth E Mulvaney
(74) *Attorney, Agent, or Firm* — Element IP, PLC

(57) ABSTRACT

Provided is an n-type GaN crystal, which has two main surfaces facing opposite directions from each other. One of the two main surfaces has a Ga polarity and is inclined at an angle of 0° to 10° with respect to the (0001) crystal plane. The n-type GaN crystal yields at least one X-ray anomalous transmission image having a square area of 10 mm×10 mm, preferably 15 mm×15 mm, and more preferably 20 mm×20 mm. In addition, the n-type GaN crystal has a Si concentration of $5\times10^{16}$ atoms/$cm^3$ or higher, O concentration of (Continued)

$3 \times 10^{16}$ atoms/cm$^3$ or lower, and/or a H concentration of $1 \times 10^{17}$ atoms/cm$^3$ or lower.

20 Claims, 16 Drawing Sheets

Related U.S. Application Data continuation of application No. 17/176,237, filed on Feb. 16, 2021, now Pat. No. 11,987,903, which is a continuation of application No. PCT/JP2019/028991, filed on Jul. 24, 2019.

(51) Int. Cl.

| | |
|---|---|
| ***C23C 16/34*** | (2006.01) |
| ***C30B 25/20*** | (2006.01) |
| ***C30B 29/40*** | (2006.01) |
| ***H10D 62/40*** | (2025.01) |
| ***H10D 62/60*** | (2025.01) |
| ***H10D 62/85*** | (2025.01) |
| ***H10H 20/01*** | (2025.01) |
| ***H10H 20/81*** | (2025.01) |
| ***H10H 20/817*** | (2025.01) |
| ***H10H 20/825*** | (2025.01) |
| ***H10P 14/20*** | (2026.01) |

(52) U.S. Cl.

CPC ........... *C30B 25/20* (2013.01); *H10D 62/405* (2025.01); *H10D 62/60* (2025.01); *H10D 62/8503* (2025.01); *H10H 20/0137* (2025.01); *H10H 20/817* (2025.01); *H10H 20/8215* (2025.01); *H10H 20/825* (2025.01); *H10P 14/2908* (2026.01); *H10P 14/3416* (2026.01); *H10P 14/3442* (2026.01)

(56) References Cited

U.S. PATENT DOCUMENTS

| | | | |
|---|---|---|---|
| 2007/0012943 | A1 | 1/2007 | Okahisa |
| 2007/0228407 | A1 | 10/2007 | Takeda |
| 2009/0081110 | A1 | 3/2009 | Shibata et al. |
| 2009/0127664 | A1 | 5/2009 | Okahisa et al. |
| 2012/0034149 | A1 | 2/2012 | Fujiwara et al. |
| 2012/0326169 | A1 | 12/2012 | Sakai et al. |
| 2017/0327971 | A1 | 11/2017 | Fujisawa et al. |
| 2019/0189438 | A1 | 6/2019 | Mikawa et al. |

FOREIGN PATENT DOCUMENTS

| | | | |
|---|---|---|---|
| JP | 2007217227 | A | 8/2007 |
| JP | 2008227479 | A | 9/2008 |
| JP | 2009126723 | A | 6/2009 |
| JP | 2009269816 | A | 11/2009 |
| JP | 2011256082 | A | 12/2011 |
| JP | 2014534941 | A | 12/2014 |
| JP | 2015214441 | A | 12/2015 |
| JP | 2018024538 | A | 2/2018 |
| JP | 2018024539 | A | 2/2018 |
| WO | WO-2016125890 | A1 | 8/2016 |
| WO | WO-2018030311 | A1 | 2/2018 |

OTHER PUBLICATIONS

Combined Chinese Office Action and Search Report issued Aug. 10, 2022 in Patent Application No. 201980053810.4 (with English translation).

Combined Chinese Office Action and Search Report issued Jan. 29, 2022 in Patent Application No. 201980053810.4 (with English translation), 20 pages.

Combined Taiwanese Office Action and Search Report issued Nov. 27, 2023 in Patent Application No. 108126120 (with English translation), 78 pages.

Extended European Search Report issued Sep. 21, 2021 in Patent Application No. 19849371.0, 11 pages.

Final Office Action issued Dec. 30, 2024, in corresponding Korean Patent Application No. 10-2021-7007730 (with machine English translation), 8 pages.

Freitas et al., "HVPE GaN wafers with improved crystalline and electrical properties", Journal of Crystal Growth, vol. 456, XP029836153, 2016, pp. 113-120.

H. Amano, "Progress and Prospect of the Growth of Wide-Band-Gap Group III Nitrides: Development of the Growth Method for Single-Crystal Bulk GaN", Japanese Journal of Applied Physics, 52, 2013, 050001-1-050001-10.

International Preliminary Report on Patentability and Written Opinion issued Feb. 23, 2021 in PCT/JP2019/028991 (English translation only), 23 pages.

International Search Report issued Oct. 21, 2019 in PCT/JP2019/028991 (English translation only), 6 pages.

Iwinska, M. et al., "Crystal growth of HVPE-GaN doped with germanium", Journal of Crystal Growth, 2017, vol. 480, pp. 102-107.

Iwinska, M. et al., "Homoepitaxial growth of HVPE-GaN doped with Si", Journal of Crystal Growth, 2016, vol. 456, pp. 91-96.

J. Z. Domagala et al., "Influence of edge-grown HVPE GaN on the structural quality of c-plane oriented HVPE-GaN grown on ammonothermal GaN substrates", Journal of Crystal Growth, 2016, vol. 456, pp. 80-85.

Office Action issued Apr. 5, 2022 in Japanese Patent Application No. 2021-007728 (with English machine translation), 19 pages.

Office Action issued Mar. 22, 2024 in corresponding Korean Patent Application No. 10-2021-7007730 (with machine English translation), 49 pages.

Office Action issued Mar. 28, 2024 in corresponding European Patent Application No. 19849371.0, 7 pages.

Office Action issued Mar. 5, 2024 in Japanese Patent Application No. 2020-537396 (with machine English translation), 7 pages.

Office Action issued Sep. 5, 2023 in Japanese Patent Application No. 2020-537396 (with English translation), 15 pages.

Y. Tsukada et al., "High-quality, 2-inch-diameter m-plane GaN substrates grown by hydride vapor phase epitaxy on acidic ammonothermal seeds", Japanese Journal of Applied Physics, 55, 2016, 05FC01-1-05FC01-5.

Combined Chinese Office Action and Search Report issued Dec. 29, 2025, in corresponding Chinese Patent Application No. 202310347233.8 (with machine English translation), 20 pages.

* cited by examiner n-TYPE GaN CRYSTAL, GaN WAFER, AND GaN CRYSTAL, GaN WAFER AND NITRIDE SEMICONDUCTOR DEVICE PRODUCTION METHOD

CROSS-REFERENCE TO RELATED APPLICATIONS

This is a continuation of U.S. patent application Ser. No. 18/623,278, filed on Apr. 1, 2024, which is a continuation of U.S. patent application Ser. No. 17/176,237, filed on Feb. 16, 2021, which is a continuation of International Application PCT/JP2019/028991, filed on Jul. 24, 2019, designated the U.S., and claiming priority from Japanese Patent Application 2018-153432 which was filed on Aug. 17, 2018, Japanese Patent Application 2019-059630 which was filed on Mar. 27, 2019, and Japanese Patent Application 2019-080810 which was filed on Apr. 22, 2019, the entire contents of which are incorporated herein by reference.

TECHNICAL FIELD

The present invention mainly relates to: an n-type GaN crystal; a GaN wafer; and methods of producing a GaN crystal, a GaN wafer, and a nitride semiconductor device.

BACKGROUND ART

GaN (gallium nitride) is one of Group III-V compound semiconductors and has a wurtzite-type crystal structure belonging to a hexagonal system.

Representative methods of growing a bulk GaN crystal include HVPE (Hydride Vapor-Phase Epitaxy), a high-pressure solution growth method, an ammonothermal method, and an Na flux method (Non-patent Document 1). HVPE has a markedly higher GaN crystal growth rate than other methods, and almost all of the GaN wafers that are commercially available today are grown by HVPE.

There is a report that a GaN crystal was grown by HVPE on a c-plane GaN seed wafer of 1 inch in diameter that was grown by an ammonothermal method, and a c-plane GaN wafer of 18 mm in diameter was cut out from the GaN crystal (Non-patent Document 2).

There is also a report that a GaN crystal was grown by HVPE on a c-plane GaN seed wafer grown by an ammonothermal method and, on a c-plane seed wafer cut out from the thus HVPE-grown GaN crystal, a Si (silicon)-doped GaN crystal was grown by HVPE (Non-patent Document 3). This Si-doped GaN crystal had a (002) XRD rocking curve FWHM of 32 arcsec.

It was reported that a Ge (germanium)-doped GaN crystal was grown by HVPE on a c-plane GaN seed wafer grown by an ammonothermal method (Non-patent Document 4). This Ge-doped GaN crystal had a (002) XRD rocking curve FWHM of 67 arcsec.

It was also reported that a 5.6 mm-thick GaN crystal was grown by HVPE on an m-plane GaN seed wafer grown by an acidic ammonothermal method, and an m-plane GaN wafer of 2 inches in diameter was cut out from the thus HVPE-grown GaN crystal (Non-patent Document 5). This 2-inch HVPE wafer attained a (200) XRD rocking curve FWHM of 13 arcsec at its center.

There is known a conductive c-plane GaN wafer having a (004) XRD rocking curve FWHM of about 10 arcsec, which is composed of a GaN crystal grown by an acidic ammonothermal method using $NH_4F$ (ammonium fluoride) and $NH_4I$ (ammonium iodide) as mineralizers (Patent Document 1).

The term "XRD" used above means X-ray diffraction, and "FWHM" stands for full width at half maximum.

RELATED ART DOCUMENTS

Patent Document

[Patent Document 1] WO2018/030311A1

Non-Patent Documents

[Non-patent Document 1] H. Amano, Japanese Journal of Applied Physics 52 (2013) 050001
[Non-patent Document 2] J. Z. Domagala, et al., Journal of Crystal Growth 456 (2016) 80
[Non-patent Document 3] M. Iwinska, et al., Journal of Crystal Growth 456 (2016) 91
[Non-patent Document 4] M. Iwinska, et al., Journal of Crystal Growth 480 (2017) 102
[Non-patent Document 5] Y. Tsukada, et al., Japanese Journal of Applied Physics 55 (2016) 05FC01

SUMMARY OF THE INVENTION

Problems to be Solved by the Invention

The present inventors thought that, if a GaN crystal having a (004) XRD rocking curve FWHM of 20 arcsec or less, which is equivalent to a GaN crystal grown by an ammonothermal method, could be grown by HVPE with excellent mass productivity, it would contribute to development promotion and cost reduction of nitride semiconductor devices produced using a c-plane GaN wafer as a substrate.

Means for Solving the Problems

The present invention relates to: an n-type GaN crystal in one aspect; a GaN wafer in another aspect; a method of producing a GaN wafer in yet another aspect; a method of producing an epitaxial wafer in yet another aspect; an epitaxial wafer in yet another aspect; a method of producing a nitride semiconductor device in yet another aspect; and a method of producing a bulk GaN crystal in yet another aspect.

Embodiments of the present invention include, but not limited to: the following [A1] to [A26].

[A1] An n-type GaN crystal, characterized in that a donor impurity contained at the highest concentration is Ge, and the n-type GaN crystal has a room-temperature resistivity of lower than 0.03 Ω·cm, and a (004) XRD rocking curve FWHM of less than 20 arcsec, less than 18 arcsec, less than 16 arcsec, less than 14 arcsec, less than 12 arcsec.

[A2] The n-type GaN crystal according to [A1], wherein the crystal has two main surfaces facing the opposite directions from each other,
the two main surfaces each have an area of 3 $cm^2$ or larger, and
one of the two main surfaces has a Ga polarity and is inclined at an angle of 0° to 10° with respect to a (0001) crystal plane.

[A3] The n-type GaN crystal according to [A2], having a diameter of 20 mm or larger, 45 mm or larger, 95 mm or larger, or 145 mm or larger.

[A4] An n-type GaN crystal, having two main surfaces facing the opposite directions from each other, one of the two main surfaces has a Ga polarity and is inclined at an angle of 0° to 10° with respect to a (0001) crystal plane, wherein a donor impurity contained at the highest concentration is Ge, the n-type GaN crystal has a room-temperature resistivity of lower than 0.03 Ω·cm, and when a (004) XRD rocking curve is measured on the one of the two main surfaces along at least one line over a length of 40 mm at 1-mm intervals, a maximum value of a (004) XRD rocking curve FWHM among all measurement points is 20 arcsec or less.

[A5] The n-type GaN crystal according to [A4], wherein an average value of the (004) XRD rocking curve FWHM among all measurement points is 18 arcsec or less, 16 arcsec or less, 14 arcsec or less, 12 arcsec or less, or 10 arcsec or less.

[A6] An n-type GaN crystal, having two main surfaces facing the opposite directions from each other, one of the two main surfaces has a Ga polarity and is inclined at an angle of 0° to 10° with respect to a (0001) crystal plane, wherein a donor impurity contained at the highest concentration is Ge, the n-type GaN crystal has a room-temperature resistivity of lower than 0.03 Ω·cm, and when a (004) XRD rocking curve is measured on the one of the two main surfaces along each of at least two lines perpendicular to one another over a length of 40 mm at 1-mm intervals, a maximum value of a (004) XRD rocking curve FWHM among all measurement points on each line is 20 arcsec or less.

[A7] The n-type GaN crystal according to [A6], wherein an average value of the (004) XRD rocking curve FWHM among all measurement points on each line is 18 arcsec or less, 16 arcsec or less, 14 arcsec or less, 12 arcsec or less, or 10 arcsec or less.

[A8] The n-type GaN crystal according to any one of [A2] to [A7], having a room-temperature resistivity of lower than 0.02 Ω·cm, lower than 0.015 Ω·cm, or lower than 0.010 Ω·cm.

[A9] The n-type GaN crystal according to any one of [A2] to [A7], having a carrier concentration of $1\times10^{18}$ $cm^{-3}$ or higher, $2\times10^{18}$ $cm^{-3}$ or higher, $3\times10^{18}$ $cm^{-3}$ or higher, or $4\times10^{18}$ $cm^{-3}$ or higher.

[A10] The n-type GaN crystal according to any one of [A2] to [A9], satisfying at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[A11] The n-type GaN crystal according to [A10], satisfying all of the conditions (a) to (c) regarding the impurity concentrations.

[A12] The n-type GaN crystal according to any one of [A2] to [A11], wherein the O concentration is $3\times10^{16}$ atoms/$cm^3$ or lower, $2\times10^{16}$ atoms/$cm^3$ or lower, or $1\times10^{16}$ atoms/$cm^3$ or lower.

[A13] The n-type GaN crystal according to any one of [A2] to [A12], wherein the Ge concentration is $1\times10^{18}$ atoms/$cm^3$ or higher, and the Si concentration is $4\times10^{17}$ atoms/$cm^3$ or higher.

[A14] The n-type GaN crystal according to any one of [A2] to [A13], wherein the concentration of each impurity excluding Ge, Si, O and H is $5\times10^{15}$ atoms/$cm^3$ or lower. [A15] The n-type GaN crystal according to any one of [A2] to [A14], which is a GaN crystal grown by HVPE.

[A16] A GaN wafer, including the n-type GaN crystal according to any one of [A2] to [A15].

[A17] A GaN wafer, wherein a first region composed of the n-type GaN crystal according to any one of [A2] to [A15] is formed on a Ga-polar side, and a second region having a lower carrier concentration than the n-type GaN crystal is formed on an N-polar side.

[A18] The GaN wafer according to [A17], wherein the first region has a thickness of 5 μm to 250 μm.

[A19] The GaN wafer according to [A17] or [A18], wherein the second region satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[A20] The GaN wafer according to [A19], wherein the second region satisfies all of the conditions (a) to (c) regarding the impurity concentrations.

[A21] The GaN wafer according to any one of [A17] to [A20], wherein the O concentration in the second region is $3\times10^{16}$ atoms/$cm^3$ or lower, $2\times10^{16}$ atoms/$cm^3$ or lower, or $1\times10^{16}$ atoms/$cm^3$ or lower.

[A22] The GaN wafer according to any one of [A17] to [A21], wherein the concentration of each impurity excluding Si, O and H in the second region is $5\times10^{15}$ atoms/$cm^3$ or lower.

[A23] The GaN wafer according to any one of [A17] to [A22], including a regrowth interface between the first region and the second region.

[A24] A method of producing an epitaxial wafer, the method including the steps of:

preparing the GaN wafer according to any one of [A16] to [A23]; and epitaxially growing at least one nitride semiconductor layer on the thus prepared GaN wafer.

[A25] An epitaxial wafer, including:

the GaN wafer according to any one of [A16] to [A23]; and at least one nitride semiconductor layer epitaxially grown on the GaN wafer.

[A26] A method of producing a nitride semiconductor device, the method including the steps of:

preparing the GaN wafer according to any one of [A16] to [A23]; and epitaxially growing at least one nitride semiconductor layer on the thus prepared GaN wafer.

Embodiments of the present invention further include the following [B1] to [B29].

[B1] An n-type GaN crystal, having a room-temperature resistivity of lower than 0.03 Ω·cm and a (004) XRD rocking curve FWHM of less than 20 arcsec, and satisfying at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[B2] The n-type GaN crystal according to [B1], wherein the crystal has two main surfaces facing the opposite directions from each other, the two main surfaces each have an area of 3 $cm^2$ or larger, and one of the two main surfaces has a Ga polarity and is inclined at an angle of 0° to 10° with respect to a (0001) crystal plane.

[B3] The n-type GaN crystal according to [B2], having a diameter of 20 mm or larger, 45 mm or larger, 95 mm or larger, or 145 mm or larger.

[B4] An n-type GaN crystal, having two main surfaces facing the opposite directions from each other, one of the two main surfaces has a Ga polarity and is inclined at an angle of 0° to 10° with respect to a (0001) crystal plane, wherein the n-type GaN crystal has a room-temperature resistivity of lower than 0.03 Ω·cm, when a (004) XRD rocking curve is measured on the one of the two main surfaces along at least one line over a length of 40 mm at 1-mm intervals, a maximum value of a (004) XRD rocking curve FWHM among all measurement points is 20 arcsec or less, and the n-type GaN crystal satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[B5] The n-type GaN crystal according to [B4], wherein an average value of the (004) XRD rocking curve FWHM among all measurement points is 18 arcsec or less, 16 arcsec or less, 14 arcsec or less, or 12 arcsec or less.

[B6] An n-type GaN crystal, having two main surfaces facing the opposite directions from each other, one of the two main surfaces has a Ga polarity and is inclined at an angle of 0° to 10° with respect to a (0001) crystal plane, wherein the n-type GaN crystal has a room-temperature resistivity of lower than 0.03 Ω·cm, when a (004) XRD rocking curve is measured on the one of the two main surfaces along each of at least two lines perpendicular to one another over a length of 40 mm at 1-mm intervals, a maximum value of a (004) XRD rocking curve FWHM among all measurement points on each line is 20 arcsec or less, and the n-type GaN crystal satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[B7] The n-type GaN crystal according to [B6], wherein an average value of the (004) XRD rocking curve FWHM among all measurement points on each line is 18 arcsec or less, 16 arcsec or less, 14 arcsec or less, or 12 arcsec or less.

[B8] The n-type GaN crystal according to any one of [B2] to [B7], having a room-temperature resistivity of lower than 0.02 Ω·cm, lower than 0.015 Ω·cm, or lower than 0.010 Ω·cm.

[B9] The n-type GaN crystal according to any one of [B2] to [B7], having a carrier concentration of $1\times10^{18}$ $cm^{-3}$ or higher, or $2\times10^{18}$ $cm^{-3}$ or higher.

[B10] The n-type GaN crystal according to any one of [B2] to [B9], satisfying all of the conditions (a) to (c) regarding the impurity concentrations.

[B11] The n-type GaN crystal according to any one of [B2] to [B10], wherein the O concentration is $3\times10^{16}$ atoms/$cm^3$ or lower, $2\times10^{16}$ atoms/$cm^3$ or lower, or $1\times10^{16}$ atoms/$cm^3$ or lower.

[B12] The n-type GaN crystal according to any one of [B2] to [B11], wherein a donor impurity contained at the highest concentration is Si.

[B13] The n-type GaN crystal according to [B12], wherein a total concentration of donor impurities excluding Si is 10% or less, 5% or less, or 1% or less, of the Si concentration.

[B14] The n-type GaN crystal according to [B13], wherein the carrier concentration is 90% or more of the Si concentration.

[B15] The n-type GaN crystal according to any one of [B2] to [B14], wherein the concentration of each impurity excluding Si, O and H is $5\times10^{15}$ atoms/$cm^3$ or lower.

[B16] The n-type GaN crystal according to any one of [B2] to [B12], wherein the Ge concentration is $1\times10^{18}$ atoms/$cm^3$ or higher, and the Si concentration is $4\times10^{17}$ atoms/$cm^3$ or higher.

[B17] The n-type GaN crystal according to [B16], wherein the concentration of each impurity excluding Ge, Si, O and H is $5\times10^{15}$ atoms/$cm^3$ or lower.

[B18] The n-type GaN crystal according to any one of [B2] to [B17], which is a GaN crystal grown by HVPE.

[B19] A GaN wafer, including the n-type GaN crystal according to any one of [B2] to [B18].

[B20] A GaN wafer, wherein a first region composed of the n-type GaN crystal according to any one of [A2] to [A18] is formed on a Ga-polar side, and a second region having a lower carrier concentration than the n-type GaN crystal is formed on an N-polar side.

[B21] The GaN wafer according to [B20], wherein the first region has a thickness of 5 μm to 250 μm.

[B22] The GaN wafer according to [B20] or [B21], wherein the second region satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[B23] The GaN wafer according to [B22], wherein the second region satisfies all of the conditions (a) to (c) regarding the impurity concentrations.

[B24] The GaN wafer according to any one of [B20] to [B23], wherein the O concentration in the second region is $3\times10^{16}$ atoms/$cm^3$ or lower, $2\times10^{16}$ atoms/$cm^3$ or lower, or $1\times10^{16}$ atoms/$cm^3$ or lower.

[B25] The GaN wafer according to any one of [B20] to [B24], wherein the concentration of each impurity excluding Si, O and H in the second region is $5\times10^{15}$ atoms/$cm^3$ or lower.

[B26] The GaN wafer according to any one of [B20] to [B25], including a regrowth interface between the first region and the second region.

[B27] A method of producing an epitaxial wafer, the method including the steps of:

preparing the GaN wafer according to any one of [B19] to [B26]; and epitaxially growing at least one nitride semiconductor layer on the thus prepared GaN wafer.

[B28] An epitaxial wafer, including:

the GaN wafer according to any one of [B19] to [B26]; and at least one nitride semiconductor layer epitaxially grown on the GaN wafer.

[B29] A method of producing a nitride semiconductor device, the method including the steps of:

preparing the GaN wafer according to any one of [B19] to [B26]; and epitaxially growing at least one nitride semiconductor layer on the thus prepared GaN wafer.

Embodiments of the present invention further include the following [C1] to [C44].

[C1] An n-type GaN crystal, having two main surfaces facing the opposite directions from each other, one of the two main surfaces has a Ga polarity and is inclined at an angle of 0° to 10° with respect to a (0001) crystal plane, wherein the n-type GaN crystal has a diameter of 45 mm or larger and a (004) XRD rocking curve FWHM of less than 20 arcsec, less than 18 arcsec, less than 16 arcsec, less than 14 arcsec, or less than 12 arcsec, and satisfies at least one condition selected from the following (a) to (c) regarding the impurity concentrations:

(a) the Si concentration is $5\times10^{16}$ atoms/cm$^3$ or higher;

(b) the O concentration is $3\times10^{16}$ atoms/cm$^3$ or lower; and (c) the H concentration is $1\times10^{17}$ atoms/cm$^3$ or lower.

[C2] The n-type GaN crystal according to [C1], having a diameter of 95 mm or larger, or 145 mm or larger.

[C3] An n-type GaN crystal, having two main surfaces facing the opposite directions from each other, one of the two main surfaces has a Ga polarity and is inclined at an angle of 0° to 10° with respect to a (0001) crystal plane, wherein when a (004) XRD rocking curve is measured on the one of the two main surfaces along at least one line over a length of 40 mm at 1-mm intervals, a maximum value of a (004) XRD rocking curve FWHM among all measurement points is 20 arcsec or less, and the n-type GaN crystal satisfies at least one condition selected from the following (a) to (c) regarding the impurity concentrations:

(a) the Si concentration is $5\times10^{16}$ atoms/cm$^3$ or higher;

(b) the O concentration is $3\times10^{16}$ atoms/cm$^3$ or lower; and (c) the H concentration is $1\times10^{17}$ atoms/cm$^3$ or lower.

[C4] The n-type GaN crystal according to [C3], wherein an average value of the (004) XRD rocking curve FWHM among all measurement points is 18 arcsec or less, 16 arcsec or less, 14 arcsec or less, 12 arcsec or less, or 10 arcsec or less.

[C5] An n-type GaN crystal, having two main surfaces facing the opposite directions from each other, one of the two main surfaces has a Ga polarity and is inclined at an angle of 0° to 10° with respect to a (0001) crystal plane, wherein when a (004) XRD rocking curve is measured on the one of the two main surfaces along each of at least two lines perpendicular to one another over a length of 40 mm at 1-mm intervals, a maximum value of a (004) XRD rocking curve FWHM among all measurement points on each line is 20 arcsec or less, and the n-type GaN crystal satisfies at least one condition selected from the following (a) to (c) regarding the impurity concentrations:

(a) the Si concentration is $5\times10^{16}$ atoms/cm$^3$ or higher;

(b) the O concentration is $3\times10^{16}$ atoms/cm$^3$ or lower; and (c) the H concentration is $1\times10^{17}$ atoms/cm$^3$ or lower.

[C6] The n-type GaN crystal according to [C5], wherein an average value of the (004) XRD rocking curve FWHM among all measurement points on each line is 18 arcsec or less, 16 arcsec or less, 14 arcsec or less, 12 arcsec or less, or 10 arcsec or less.

[C7] The n-type GaN crystal according to any one of [C1] to [C6], satisfying all of the conditions (a) to (c) regarding the impurity concentrations.

[C8] The n-type GaN crystal according to any one of [C1] to [C7], wherein the Si concentration is $5\times10^{17}$ atoms/cm$^3$ or lower.

[C9] The n-type GaN crystal according to any one of [C1] to [C8], wherein the concentration of each impurity excluding Si, O and H is $5\times10^{15}$ atoms/cm$^3$ or lower.

[C10] The n-type GaN crystal according to any one of [C1] to [C9], wherein the O concentration is $3\times10^{16}$ atoms/cm$^3$ or lower, $2\times10^{16}$ atoms/cm$^3$ or lower, or $1\times10^{16}$ atoms/cm$^3$ or lower.

[C11] The n-type GaN crystal according to any one of [C1] to [C10], having at least either a carrier concentration of lower than $5\times10^{17}$ cm$^{-3}$ or a room-temperature resistivity of 0.04 Ω·cm or higher.

[C12] The n-type GaN crystal according to any one of [C1] to [C11], which is a GaN crystal grown by HVPE.

[C13] A GaN wafer, including the n-type GaN crystal according to any one of [C1] to [C12].

[C14] A bilayer GaN wafer, including:

a back layer composed of the n-type GaN crystal according to any one of [C1] to [C12]; and a front layer composed of GaN, which is formed on a main surface of a Ga-polar side of the n-type GaN crystal via a regrowth interface and has a minimum thickness of 20 μm or larger, wherein in the front layer, at least a portion within a distance of 5 μm from an upper surface is contained in a high-carrier-concentration region, and the high-carrier-concentration region is a region in which a lower limit of the carrier concentration is $1\times10^{18}$ cm$^{-3}$ or higher.

[C15] The bilayer GaN wafer according to [C14], wherein, in the front layer, at least a portion within 20 μm from the upper surface is contained in the high-carrier-concentration region.

[C16] The bilayer GaN wafer according to [C14] or [C15], wherein the high-carrier-concentration region is a region in which the lower limit of the carrier concentration is $2\times10^{18}$ cm$^{-3}$ or higher, $3\times10^{18}$ cm$^{-3}$ or higher, or $4\times10^{18}$ cm$^{-3}$ or higher.

[C17] The bilayer GaN wafer according to any one of [C14] to [C16], wherein the front layer satisfies at least one condition selected from the following (a) to (c) regarding the impurity concentrations:

(a) the Si concentration is $5\times10^{16}$ atoms/cm$^3$ or higher;

(b) the O concentration is $3\times10^{16}$ atoms/cm$^3$ or lower; and (c) the H concentration is $1\times10^{17}$ atoms/cm$^3$ or lower.

[C18] The bilayer GaN wafer according to [C17], wherein the front layer satisfies all of the conditions (a) to (c) regarding the impurity concentrations.

[C19] The bilayer GaN wafer according to any one of [C14] to [C18], wherein the O concentration in the front layer is $3\times10^{16}$ atoms/cm$^3$ or lower, $2\times10^{16}$ atoms/cm$^3$ or lower, or $1\times10^{16}$ atoms/cm$^3$ or lower.

[C20] The bilayer GaN wafer according to any one of [C14] to [C19], wherein the high-carrier-concentration region is doped with Si.

[C21] The bilayer GaN wafer according to [C20], wherein the concentration of each impurity excluding Si, O and H in the front layer is $5\times10^{15}$ atoms/cm$^3$ or lower.

[C22] The bilayer GaN wafer according to any one of [C14] to [C20], wherein the high-carrier-concentration region is doped with Ge.

[C23] The bilayer GaN wafer according to [C22], wherein the concentration of each impurity excluding Ge, Si, O and H in the front layer is $5\times10^{15}$ atoms/cm$^3$ or lower.

[C24] The bilayer GaN wafer according to any one of [C14] to [C23], wherein, in the high-carrier-concentration region, a variation in the carrier concentration along the c-axis direction or in a total concentration of donor impurities is within ±25%, within ±20%, within ±15%, or within ±10%, from a median value.

[C25] A bilayer GaN wafer, including:

a back layer composed of the n-type GaN crystal according to any one of [C1] to [C12]; and a front layer composed of GaN, which is formed on a main surface of a Ga-polar side of the n-type GaN crystal via a regrowth interface and has a minimum thickness of 20 μm or larger, wherein in the front layer, at least a portion within a distance of 5 μm from an upper surface is contained in a carrier compensation region, and the carrier compensation region is a region in which a lower limit of a total concentration of compensating impurities is $1\times10^{17}$ atoms/cm$^3$ or higher.

[C26] The bilayer GaN wafer according to [C25], wherein, in the front layer, at least a portion within 20 μm from the upper surface is contained in the carrier compensation region.

[C27] The bilayer GaN wafer according to [C25] or [C26], wherein the carrier compensation region is a region in which the lower limit of the total concentration of compensating impurities is $2\times10^{17}$ atoms/cm$^3$ or higher, $5\times10^{17}$ atoms/cm$^3$ or higher, $1\times10^{18}$ atoms/cm$^3$ or higher, $2\times10^{18}$ atoms/cm$^3$ or higher, or $5\times10^{18}$ atoms/cm$^3$ or higher.

[C28] The bilayer GaN wafer according to any one of [C25] to [C27], wherein the front layer satisfies at least one condition selected from the following (a) to (c) regarding the impurity concentrations:

(a) the Si concentration is $5\times10^{16}$ atoms/cm$^3$ or higher;

(b) the O concentration is $3\times10^{16}$ atoms/cm$^3$ or lower; and (c) the H concentration is $1\times10^{17}$ atoms/cm$^3$ or lower.

[C29] The bilayer GaN wafer according to any one of [C25] to [C28], wherein, in the carrier compensation region, a variation in the total concentration of compensating impurities along the c-axis direction is within ±25%, within ±20%, within ±15%, or within ±10%, from a median value.

[C30] The bilayer GaN wafer according to any one of [C14] to [C29], wherein the bilayer GaN wafer has a thickness of larger than 300 μm, and the front layer has a maximum thickness of 300 μm or less, 250 μm or less, or 200 μm or less.

[C31] The bilayer GaN wafer according to any one of [C14] to [C30], wherein the front layer has a minimum thickness of 50 μm or larger, 75 μm or larger, or 100 μm or larger.

[C32] The bilayer GaN wafer according to any one of [C14] to [C31], wherein a difference between the maximum thickness and the minimum thickness of the front layer is 200 μm or less, 100 μm or less, 50 μm or less, 25 μm or less, or 10 μm or less.

[C33] A method of producing an epitaxial wafer, the method including the steps of:

preparing the wafer according to any one of [C13] to [C32]; and epitaxially growing at least one nitride semiconductor layer on the thus prepared wafer.

[C34] An epitaxial wafer, including:

the wafer according to any one of [C13] to [C32]; and at least one nitride semiconductor layer epitaxially grown on the GaN wafer.

[C35] A method of producing a nitride semiconductor device, the method including the steps of:

preparing the wafer according to any one of [C13] to [C32]; and epitaxially growing at least one nitride semiconductor layer on the thus prepared wafer.

[C36] A method of producing a bilayer GaN wafer, the method including the steps of:

preparing the GaN wafer according to [C13]; and epitaxially growing a GaN layer having a thickness of 20 μm or larger on a main surface of a Ga-polar side of the thus prepared GaN wafer, wherein a high-carrier-concentration region or a carrier compensation region is formed on the GaN layer, the high-carrier-concentration region is a region in which a lower limit of the carrier concentration is $1\times10^{18}$ cm$^{-3}$ or higher, and the carrier compensation region is a region in which a lower limit of a total concentration of compensating impurities is $2\times10^{17}$ atoms/cm$^3$ or higher.

[C37] The method according to [C36], wherein, in the epitaxial growth step, the GaN layer is grown by HVPE.

[C38] The method according to [C36] or [C37], wherein the GaN layer has a thickness of 500 μm or less.

[C39] The method according to any one of [C36] to [C38], wherein the high-carrier-concentration region is formed on the GaN layer, and the high-carrier-concentration region is a region in which the lower limit of the carrier concentration is $2\times10^{18}$ cm$^{-3}$ or higher, $3\times10^{18}$ cm$^{-3}$ or higher, or $4\times10^{18}$ cm$^{-3}$ or higher.

[C40] The method according to any one of [C36] to [C39], wherein the high-carrier-concentration region is formed on the GaN layer and doped with Ge.

[C41] The method according to any one of [C36] to [C40], wherein the high-carrier-concentration region is formed on the GaN layer and intentionally doped with Si.

[C42] The method according to any one of [C36] to [C38], wherein the carrier compensation region is formed on the GaN layer, and the carrier compensation region is a region in which the lower limit of the total concentration of compensating impurities is $5\times10^{17}$ atoms/cm$^3$ or higher, $1\times10^{18}$ atoms/cm$^3$ or higher, $2\times10^{18}$ atoms/cm$^3$ or higher, or $5\times10^{18}$ atoms/cm$^3$ or higher.

[C43] The method according to any one of [C36] to [C42], further including the step of thinning a laminate obtained in the epitaxial growth step.

[C44] A method of producing a bulk GaN crystal, the method including the steps of:
preparing the GaN wafer according to [C13]; and
epitaxially growing GaN on the thus prepared GaN wafer.

Embodiments of the present invention further include the following [D1] to [D19].

[D1] A c-plane GaN wafer, characterized in that:
a donor impurity contained at the highest concentration is Ge;
the conductivity type is an n-type; and
the c-plane GaN wafer has a room-temperature resistivity of lower than 0.03 Ω·cm, and a (004) XRD rocking curve FWHM of less than 20 arcsec, less than 18 arcsec, less than 16 arcsec, less than 14 arcsec, or less than 12 arcsec.

[D2] The c-plane GaN wafer according to [D1], including a main surface having an area of 3 $cm^2$ or larger.

[D3] The c-plane GaN wafer according to [D1], having a diameter of 20 mm or larger, 45 mm or larger, 95 mm or larger, or 145 mm or larger.

[D4] A c-plane GaN wafer, characterized in that:
a donor impurity contained at the highest concentration is Ge;
the conductivity type is an n-type;
the c-plane GaN wafer has a room-temperature resistivity of lower than 0.03 Ω·cm; and
when a (004) XRD rocking curve is measured on one of main surfaces along at least one line over a length of 40 mm at 1-mm intervals, a maximum value of a (004) XRD rocking curve FWHM among all measurement points is 20 arcsec or less.

[D5] The c-plane GaN wafer according to [D4], wherein an average value of the (004) XRD rocking curve FWHM among all measurement points is 18 arcsec or less, 16 arcsec or less, 14 arcsec or less, 12 arcsec or less, or 10 arcsec or less.

[D6] A c-plane GaN wafer, characterized in that:
a donor impurity contained at the highest concentration is Ge;
the conductivity type is an n-type;
the c-plane GaN wafer has a room-temperature resistivity of lower than 0.03 Ω·cm; and
when a (004) XRD rocking curve is measured on one of main surfaces along each of at least two lines perpendicular to one another over a length of 40 mm at 1-mm intervals, a maximum value of a (004) XRD rocking curve FWHM among all measurement points on each line is 20 arcsec or less.

[D7] The c-plane GaN wafer according to [D6], wherein an average value of the (004) XRD rocking curve FWHM among all measurement points on each line is 18 arcsec or less, 16 arcsec or less, 14 arcsec or less, 12 arcsec or less, or 10 arcsec or less.

[D8] The c-plane GaN wafer according to any one of [D1] to [D7], wherein a variation width of an x-direction component of an off-cut angle on a line extending in the x-direction through the center of a front surface and a variation width of a y-direction component of an off-cut angle on a line extending in the y-direction perpendicular to the x-direction through the center of the front surface are each 0.15° or less, 0.1° or less, or 0.08° or less, within a 40 mm-long section.

[D9] The c-plane GaN wafer according to any one of [D1] to [D8], having a room-temperature resistivity of lower than 0.02 Ω·cm, lower than 0.015 Ω·cm, or lower than 0.010 Ω·cm.

[D10] The c-plane GaN wafer according to any one of [D1] to [D8], having a carrier concentration of $1\times10^{18}$ $cm^{-3}$ or higher, $2\times10^{18}$ $cm^{-3}$ or higher, $3\times10^{18}$ $cm^{-3}$ or higher, or $4\times10^{18}$ $cm^{-3}$ or higher.

[D11] The c-plane GaN wafer according to any one of [D1] to [D10], satisfying at least one condition selected from the following (a) to (c) regarding the impurity concentrations:
(a) the Si concentration is $5\times10^{16}$ atoms/$cm^3$ or higher;
(b) the O concentration is $3\times10^{16}$ atoms/$cm^3$ or lower; and
(c) the H concentration is $1\times10^{17}$ atoms/$cm^3$ or lower.

[D12] The c-plane GaN wafer according to [D11], satisfying all of the conditions (a) to (c) regarding the impurity concentrations.

[D13] The c-plane GaN wafer according to any one of [D1] to [D12], wherein the O concentration is $3\times10^{16}$ atoms/$cm^3$ or lower, $2\times10^{16}$ atoms/$cm^3$ or lower, or $1\times10^{16}$ atoms/$cm^3$ or lower.

[D14] The c-plane GaN wafer according to any one of [D1] to [D13], wherein the Ge concentration is $1\times10^{18}$ atoms/$cm^3$ or higher, and the Si concentration is $4\times10^{17}$ atoms/$cm^3$ or higher.

[D15] The c-plane GaN wafer according to any one of [D1] to [D14], wherein the concentration of each impurity excluding Ge, Si, O and H is $5\times10^{15}$ atoms/$cm^3$ or lower.

[D16] The c-plane GaN wafer according to any one of [D1] to [D15], including a GaN crystal grown by HVPE.

[D17] A method of producing an epitaxial wafer, the method including the steps of:
preparing the c-plane GaN wafer according to any one of [D1] to [D16]; and
epitaxially growing at least one nitride semiconductor layer on the thus prepared c-plane GaN wafer. [D18] An epitaxial wafer, including:
the GaN wafer according to any one of [D1] to [D16]; and
at least one nitride semiconductor layer epitaxially grown on the GaN wafer.

[D19] A method of producing a nitride semiconductor device, the method including the steps of:
preparing the GaN wafer according to any one of [D1] to [D16]; and
epitaxially growing at least one nitride semiconductor layer on the thus prepared GaN wafer.

Embodiments of the present invention further include the following [E1] to [E20].

[E1] A c-plane GaN wafer, characterized in that:
the conductivity type is an n-type; and
the c-plane GaN wafer has a room-temperature resistivity of lower than 0.03 Ω·cm and a (004) XRD rocking curve FWHM of less than 20 arcsec, and satisfies at least one condition selected from the following (a) to (c) regarding the impurity concentrations:
(a) the Si concentration is $5\times10^{16}$ atoms/$cm^3$ or higher;
(b) the O concentration is $3\times10^{16}$ atoms/$cm^3$ or lower; and
(c) the H concentration is $1\times10^{17}$ atoms/$cm^3$ or lower.

[E2] The c-plane GaN wafer according to [E1], including a main surface having an area of 3 $cm^2$ or larger.

[E3] The c-plane GaN wafer according to [E1], having a diameter of 20 mm or larger, 45 mm or larger, 95 mm or larger, or 145 mm or larger.

[E4] A c-plane GaN wafer, characterized in that:
the conductivity type is an n-type;
the c-plane GaN wafer has a room-temperature resistivity of lower than 0.03 Ω·cm;

when a (004) XRD rocking curve is measured on one of main surfaces along at least one line over a length of 40 mm at 1-mm intervals, a maximum value of a (004) XRD rocking curve FWHM among all measurement points is 20 arcsec or less; and the c-plane GaN wafer satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[E5] The c-plane GaN wafer according to [E4], wherein an average value of the (004) XRD rocking curve FWHM among all measurement points is 18 arcsec or less, 16 arcsec or less, 14 arcsec or less, or 12 arcsec or less.

[E6] A c-plane GaN wafer, characterized in that:

the conductivity type is an n-type;

the c-plane GaN wafer has a room-temperature resistivity of lower than 0.03 Ω·cm;

when a (004) XRD rocking curve is measured on one of main surfaces along each of at least two lines perpendicular to one another over a length of 40 mm at 1-mm intervals, a maximum value of a (004) XRD rocking curve FWHM among all measurement points on each line is 20 arcsec or less; and the c-plane GaN wafer satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[E7] The c-plane GaN wafer according to [E6], wherein an average value of the (004) XRD rocking curve FWHM among all measurement points on each line is 18 arcsec or less, 16 arcsec or less, 14 arcsec or less, or 12 arcsec or less.

[E8] The c-plane GaN wafer according to any one of [E1] to [E7], wherein a variation width of an x-direction component of an off-cut angle on a line extending in the x-direction through the center of a front surface and a variation width of a y-direction component of an off-cut angle on a line extending in the y-direction perpendicular to the x-direction through the center of the front surface are each 0.15° or less, 0.1° or less, or 0.08° or less, within a 40 mm-long section.

[E9] The c-plane GaN wafer according to any one of [E1] to [E8], having a room-temperature resistivity of lower than 0.02 Ω·cm, lower than 0.015 Ω·cm, or lower than 0.010 Ω·cm.

[E10] The c-plane GaN wafer according to any one of [E1] to [E8], having a carrier concentration of $1\times10^{18}$ $cm^{-3}$ or higher, or $2\times10^{18}$ $cm^{-3}$ or higher.

[E11] The c-plane GaN wafer according to any one of [E1] to [E10], satisfying all of the conditions (a) to (c) regarding the impurity concentrations.

[E12] The c-plane GaN wafer according to any one of [E1] to [E11], wherein the O concentration is $3\times10^{16}$ atoms/$cm^3$ or lower, $2\times10^{16}$ atoms/$cm^3$ or lower, or $1\times10^{16}$ atoms/$cm^3$ or lower.

[E13] The c-plane GaN wafer according to any one of [E1] to [E12], wherein a donor impurity contained at the highest concentration is Si.

[E14] The c-plane GaN wafer according to [E13], wherein a total concentration of donor impurities excluding Si is 10% or less, 5% or less, or 1% or less, of the Si concentration.

[E15] The c-plane GaN wafer according to [E14], wherein the carrier concentration is 90% or more of the Si concentration.

[E16] The c-plane GaN wafer according to any one of [E1] to [E15], wherein the concentration of each impurity excluding Si, O and H is $5\times10^{15}$ atoms/$cm^3$ or lower.

[E17] The c-plane GaN wafer according to any one of [E1] to [E16], including a GaN crystal grown by HVPE.

[E18] A method of producing an epitaxial wafer, the method including the steps of:

preparing the c-plane GaN wafer according to any one of [E1] to [E17]; and epitaxially growing at least one nitride semiconductor layer on the thus prepared GaN wafer.

[E19] An epitaxial wafer, including:

the c-plane GaN wafer according to any one of [E1] to [E17]; and at least one nitride semiconductor layer epitaxially grown on the c-plane GaN wafer.

[E20] A method of producing a nitride semiconductor device, the method including the steps of:

preparing the c-plane GaN wafer according to any one of [E1] to [E17]; and epitaxially growing at least one nitride semiconductor layer on the thus prepared c-plane GaN wafer.

Embodiments of the present invention further include the following [F1] to [F25].

[F1] A c-plane GaN wafer, characterized in that:

the conductivity type is an n-type; and the c-plane GaN wafer has a diameter of 45 mm or larger and a (004) XRD rocking curve FWHM of less than 20 arcsec, less than 18 arcsec, less than 16 arcsec, less than 14 arcsec, or less than 12 arcsec, and satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[F2] The c-plane GaN wafer according to [F1], having a diameter of 95 mm or larger, or 145 mm or larger.

[F3] A c-plane GaN wafer, characterized in that:

the conductivity type is an n-type;

when a (004) XRD rocking curve is measured on one of main surfaces along at least one line over a length of 40 mm at 1-mm intervals, a maximum value of a (004) XRD rocking curve FWHM among all measurement points is 20 arcsec or less; and the c-plane GaN wafer satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[F4] The c-plane GaN wafer according to [F3], wherein an average value of the (004) XRD rocking curve FWHM among all measurement points is 18 arcsec or less, 16 arcsec or less, 14 arcsec or less, 12 arcsec or less, or 10 arcsec or less.

[F5] A c-plane GaN wafer, characterized in that:

the conductivity type is an n-type;

when a (004) XRD rocking curve is measured on one of main surfaces along each of at least two lines perpendicular to one another over a length of 40 mm at 1-mm intervals, a maximum value of a (004) XRD rocking curve FWHM among all measurement points on each line is 20 arcsec or less; and the c-plane GaN wafer satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[F6] The c-plane GaN wafer according to [F5], wherein an average value of the (004) XRD rocking curve FWHM among all measurement points on each line is 18 arcsec or less, 16 arcsec or less, 14 arcsec or less, 12 arcsec or less, or 10 arcsec or less.

[F7] The c-plane GaN wafer according to any one of [F1] to [F6], wherein a variation width of an x-direction component of an off-cut angle on a line extending in the x-direction through the center of a front surface and a variation width of a y-direction component of an off-cut angle on a line extending in the y-direction perpendicular to the x-direction through the center of the front surface are each 0.15° or less, 0.1° or less, or 0.08° or less, within a 40 mm-long section.

[F8] The c-plane GaN wafer according to any one of [F1] to [F7], satisfying all of the conditions (a) to (c) regarding the impurity concentrations.

[F9] The c-plane GaN wafer according to any one of [F1] to [F8], wherein the Si concentration is $5\times10^{17}$ atoms/$cm^3$ or lower.

[F10] The c-plane GaN wafer according to any one of [F1] to [F9], wherein the concentration of each impurity excluding Si, O and H is $5\times10^{15}$ atoms/$cm^3$ or lower.

[F11] The c-plane GaN wafer according to any one of [F1] to [F10], wherein the O concentration is $3\times10^{16}$ atoms/$cm^3$ or lower, $2\times10^{16}$ atoms/$cm^3$ or lower, or $1\times10^{16}$ atoms/$cm^3$ or lower.

[F12] The c-plane GaN wafer according to any one of [F1] to [F11], having at least either a carrier concentration of lower than $5\times10^{17}$ $cm^{-3}$ or a room-temperature resistivity of 0.04 Ω·cm or higher.

[F13] The c-plane GaN wafer according to any one of [F1] to [F12], including a GaN crystal grown by HVPE.

[F14] A method of producing an epitaxial wafer, the method including the steps of:

preparing the c-plane GaN wafer according to any one of [F1] to [F13]; and epitaxially growing at least one nitride semiconductor layer on the thus prepared c-plane GaN wafer.

[F15] An epitaxial wafer, including:

the c-plane GaN wafer according to any one of [F1] to [F13]; and at least one nitride semiconductor layer epitaxially grown on the c-plane GaN wafer.

[F16] A method of producing a nitride semiconductor device, the method including the steps of:

preparing the c-plane GaN wafer according to any one of [F1] to [F13]; and epitaxially growing at least one nitride semiconductor layer on the thus prepared c-plane GaN wafer.

[F17] A method of producing a bilayer GaN wafer, the method including the steps of:

preparing the c-plane GaN wafer according to any one of [F1] to [F13]; and epitaxially growing a GaN layer having a thickness of 20 μm or larger on a main surface of a Ga-polar side of the thus prepared c-plane GaN wafer, wherein a high-carrier-concentration region or a carrier compensation region is formed on the GaN layer, the high-carrier-concentration region is a region in which a lower limit of the carrier concentration is $1\times10^{18}$ $cm^{-3}$ or higher, and the carrier compensation region is a region in which a lower limit of a total concentration of compensating impurities is $2\times10^{17}$ atoms/$cm^3$ or higher.

[F18] The method according to [F17], wherein, in the epitaxial growth step, the GaN layer is grown by HVPE.

[F19] The method according to [F17] or [F18], wherein the GaN layer has a thickness of 500 μm or less.

[F20] The method according to any one of [F17] to [F19], wherein the high-carrier-concentration region is formed on the GaN layer, and the high-carrier-concentration region is a region in which the lower limit of the carrier concentration is $2\times10^{18}$ $cm^{-3}$ or higher, $3\times10^{18}$ $cm^{-3}$ or higher, or $4\times10^{18}$ $cm^{-3}$ or higher.

[F21] The method according to any one of [F17] to [F20], wherein the high-carrier-concentration region is formed on the GaN layer and doped with Ge.

[F22] The method according to any one of [F17] to [F21], wherein the high-carrier-concentration region is formed on the GaN layer and intentionally doped with Si.

[F23] The method according to any one of [F17] to [F19], wherein the carrier compensation region is formed on the GaN layer, and the carrier compensation region is a region in which the lower limit of the total concentration of compensating impurities is $5\times10^{17}$ atoms/$cm^3$ or higher, $1\times10^{18}$ atoms/$cm^3$ or higher, $2\times10^{18}$ atoms/$cm^3$ or higher, or $5\times10^{18}$ atoms/$cm^3$ or higher.

[F24] The method according to any one of [F17] to [F23], further including the step of thinning a laminate obtained in the epitaxial growth step.

[F25] A method of producing a bulk GaN crystal, the method including the steps of:

preparing the c-plane GaN wafer according to any one of [F1] to [F13]; and epitaxially growing GaN on the thus prepared c-plane GaN wafer.

Embodiments of the present invention further include the following [G1] to [G29].

[G1] A c-plane GaN wafer, characterized in that:

the conductivity type is an n-type;

one of main surfaces has a dislocation density of $2\times10^5$ $cm^{-2}$ or lower, $1\times10^5$ $cm^{-2}$ or lower, or $5\times10^4$ $cm^{-2}$ or lower; and the c-plane GaN wafer satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

[G2] The c-plane GaN wafer according to [G1], satisfying all of the conditions (a) to (c) regarding the impurity concentrations.

[G3] The c-plane GaN wafer according to [G1] or [G2], wherein the O concentration is $3\times10^{16}$ atoms/$cm^3$ or lower, $2\times10^{16}$ atoms/$cm^3$ or lower, or $1\times10^{16}$ atoms/$cm^3$ or lower.

[G4] The c-plane GaN wafer according to any one of [G1] to [G3], wherein a variation width of an x-direction component of an off-cut angle on a line extending in the x-direction through the center of a front surface and a variation width of a y-direction component of an off-cut angle on a line extending in the y-direction perpendicular to the x-direction through the center of the front surface are each 0.15° or less, 0.1° or less, or 0.08° or less, within a 40 mm-long section.

[G5] The c-plane GaN wafer according to any one of [G1] to [G4], having at least either a carrier concentration of lower than $5\times10^{17}$ $cm^{-3}$ or a room-temperature resistivity of 0.04 Ω·cm or higher.

[G6] The c-plane GaN wafer according to any one of [G1] to [G5], wherein the Si concentration is $5\times10^{17}$ atoms/$cm^3$ or lower.

[G7] The c-plane GaN wafer according to [G6], wherein the concentration of each impurity excluding Si, O and H is $5\times10^{15}$ atoms/$cm^3$ or lower.

[G8] The c-plane GaN wafer according to any one of [G1] to [G4], having a room-temperature resistivity of lower than 0.03 Ω·cm, lower than 0.02 Ω·cm, lower than 0.015 Ω·cm, or lower than 0.010 Ω·cm.

[G9] The c-plane GaN wafer according to any one of [G1] to [G4], having a carrier concentration of $1\times10^{18}$ $cm^{-3}$ or higher, $2\times10^{18}$ $cm^{-3}$ or higher, $3\times10^{18}$ $cm^{-3}$ or higher, or $4\times10^{18}$ $cm^{-3}$ or higher.

[G10] The c-plane GaN wafer according to [G8] or [G9], wherein the Ge concentration is $1\times10^{18}$ atoms/$cm^3$ or higher, and the Si concentration is $4\times10^{17}$ atoms/$cm^3$ or higher.

[G11] The c-plane GaN wafer according to any one of [G8] to [G10], wherein a donor impurity contained at the highest concentration is Ge.

[G12] The c-plane GaN wafer according to [G10] or [G11], wherein the concentration of each impurity excluding Ge, Si, O and H is $5\times10^{15}$ atoms/$cm^3$ or lower.

[G13] The c-plane GaN wafer according to [G8] or [G9], wherein a donor impurity contained at the highest concentration is Si.

[G14] The c-plane GaN wafer according to [G13], wherein a total concentration of donor impurities excluding Si is 10% or less, 5% or less, or 1% or less, of the Si concentration.

[G15] The c-plane GaN wafer according to [G14], wherein the carrier concentration is 90% or more of the Si concentration.

[G16] The c-plane GaN wafer according to any one of [G13] to [G15], wherein the concentration of each impurity excluding Si, O and H is $5\times10^{15}$ atoms/$cm^3$ or lower.

[G17] The c-plane GaN wafer according to any one of [G1] to [G16], including a GaN crystal grown by HVPE.

[G18] A method of producing an epitaxial wafer, the method including the steps of:

preparing the c-plane GaN wafer according to any one of [G1] to [G17]; and epitaxially growing at least one nitride semiconductor layer on the thus prepared c-plane GaN wafer.

[G19] An epitaxial wafer, including:

the c-plane GaN wafer according to any one of [G1] to [G17]; and at least one nitride semiconductor layer epitaxially grown on the c-plane GaN wafer.

[G20] A method of producing a nitride semiconductor device, the method including the steps of:

preparing the c-plane GaN wafer according to any one of [G1] to [G17]; and epitaxially growing at least one nitride semiconductor layer on the thus prepared c-plane GaN wafer.

[G21] A method of producing a bilayer GaN wafer, the method including the steps of:

preparing the c-plane GaN wafer according to any one of [G1] to [G7]; and epitaxially growing a GaN layer having a thickness of 20 μm or larger on a main surface of a Ga-polar side of the thus prepared c-plane GaN wafer, wherein a high-carrier-concentration region or a carrier compensation region is formed on the GaN layer, the high-carrier-concentration region is a region in which a lower limit of the carrier concentration is $1\times10^{18}$ $cm^{-3}$ or higher, and the carrier compensation region is a region in which a lower limit of a total concentration of compensating impurities is $2\times10^{17}$ atoms/$cm^3$ or higher.

[G22] The method according to [G21], wherein, in the epitaxial growth step, the GaN layer is grown by HVPE.

[G23] The method according to [G21] or [G22], wherein the GaN layer has a thickness of 500 μm or less.

[G24] The method according to any one of [G21] to [G23], wherein the high-carrier-concentration region is formed on the GaN layer, and the high-carrier-concentration region is a region in which the lower limit of the carrier concentration is $2\times10^{18}$ $cm^{-3}$ or higher, $3\times10^{18}$ $cm^{-3}$ or higher, or $4\times10^{18}$ $cm^{-3}$ or higher.

[G25] The method according to any one of [G21] to [G24], wherein the high-carrier-concentration region is formed on the GaN layer and doped with Ge.

[G26] The method according to any one of [G21] to [G25], wherein the high-carrier-concentration region is formed on the GaN layer and intentionally doped with Si.

[G27] The method according to any one of [G21] to [G23], wherein the carrier compensation region is formed on the GaN layer, and the carrier compensation region is a region in which the lower limit of the total concentration of compensating impurities is $5\times10^{17}$ atoms/$cm^3$ or higher, $1\times10^{18}$ atoms/$cm^3$ or higher, $2\times10^{18}$ atoms/$cm^3$ or higher, or $5\times10^{18}$ atoms/$cm^3$ or higher.

[G28] The method according to any one of [G21] to [G27], further including the step of thinning a laminate obtained in the epitaxial growth step.

[G29] A method of producing a bulk GaN crystal, the method including the steps of:

preparing the c-plane GaN wafer according to any one of [G1] to [G7]; and epitaxially growing GaN on the thus prepared c-plane GaN wafer.

Embodiments of the present invention further include the following [H1] to [H32].

[H1] An n-type GaN crystal, having two main surfaces facing the opposite directions from each other, one of the two main surfaces has a Ga polarity and is inclined at an angle of 0° to 10° with respect to a (0001) crystal plane, wherein the n-type GaN crystal yields at least one X-ray anomalous transmission image having a square area of 10 mm×10 mm, and satisfies at least one condition selected from the following (a) to (c) regarding the impurity concentrations:

(a) the Si concentration is $5\times10^{16}$ atoms/cm$^3$ or higher;

(b) the O concentration is $3\times10^{16}$ atoms/cm$^3$ or lower; and (c) the H concentration is $1\times10^{17}$ atoms/cm$^3$ or lower.

[H2] An n-type GaN crystal, having two main surfaces facing the opposite directions from each other, one of the two main surfaces has a Ga polarity and is inclined at an angle of 0° to 10° with respect to a (0001) crystal plane, wherein the n-type GaN crystal yields at least one X-ray anomalous transmission image having a square area of 15 mm×15 mm, and satisfies at least one condition selected from the following (a) to (c) regarding the impurity concentrations:

(a) the Si concentration is $5\times10^{16}$ atoms/cm$^3$ or higher;

(b) the O concentration is $3\times10^{16}$ atoms/cm$^3$ or lower; and (c) the H concentration is $1\times10^{17}$ atoms/cm$^3$ or lower.

[H3] An n-type GaN crystal, having two main surfaces facing the opposite directions from each other, one of the two main surfaces has a Ga polarity and is inclined at an angle of 0° to 10° with respect to a (0001) crystal plane, wherein the n-type GaN crystal yields at least one X-ray anomalous transmission image having a square area of 20 mm×20 mm, and satisfies at least one condition selected from the following (a) to (c) regarding the impurity concentrations:

(a) the Si concentration is $5\times10^{16}$ atoms/cm$^3$ or higher;

(b) the O concentration is $3\times10^{16}$ atoms/cm$^3$ or lower; and (c) the H concentration is $1\times10^{17}$ atoms/cm$^3$ or lower.

[H4] The n-type GaN crystal according to any one of [H1] to [H3], satisfying all of the conditions (a) to (c) regarding the impurity concentrations.

[H5] The n-type GaN crystal according to any one of [H1] to [H4], wherein the O concentration is $3\times10^{16}$ atoms/cm$^3$ or lower, $2\times10^{16}$ atoms/cm$^3$ or lower, or $1\times10^{16}$ atoms/cm$^3$ or lower.

[H6] The n-type GaN crystal according to any one of [H1] to [H5], having at least either a carrier concentration of lower than $5\times10^{17}$ cm$^{-3}$ or a room-temperature resistivity of 0.04 Ω·cm or higher.

[H7] The n-type GaN crystal according to any one of [H1] to [H6], wherein the Si concentration is $5\times10^{17}$ atoms/cm$^3$ or lower.

[H8] The n-type GaN crystal according to [H7], wherein the concentration of each impurity excluding Si, O and H is $5\times10^{15}$ atoms/cm$^3$ or lower.

[H9] The n-type GaN crystal according to any one of [H1] to [H5], having a room-temperature resistivity of lower than 0.03 Ω·cm, lower than 0.02 Ω·cm, lower than 0.015 Ω·cm, or lower than 0.010 Ω·cm.

[H10] The n-type GaN crystal according to any one of [H1] to [H5], having a carrier concentration of $1\times10^{18}$ cm$^{-3}$ or higher, $2\times10^{18}$ cm$^{-3}$ or higher, $3\times10^{18}$ cm$^{-3}$ or higher, or $4\times10^{18}$ cm$^{-3}$ or higher.

[H11] The n-type GaN crystal according to [H9] or [H10], wherein the Ge concentration is $1\times10^{18}$ atoms/cm$^3$ or higher, and the Si concentration is $4\times10^{17}$ atoms/cm$^3$ or higher.

[H12] The n-type GaN crystal according to any one of [H9] to [H11], wherein a donor impurity contained at the highest concentration is Ge.

[H13] The n-type GaN crystal according to [H11] or [H12], wherein the concentration of each impurity excluding Ge, Si, O and H is $5\times10^{15}$ atoms/cm$^3$ or lower.

[H14] The n-type GaN crystal according to [H9] or [H10], wherein a donor impurity contained at the highest concentration is Si.

[H15] The n-type GaN crystal according to [H14], wherein a total concentration of donor impurities excluding Si is 10% or less, 5% or less, or 1% or less, of the Si concentration.

[H16] The n-type GaN crystal according to [H15], wherein the carrier concentration is 90% or more of the Si concentration.

[H17] The n-type GaN crystal according to any one of [H14] to [H16], wherein the concentration of each impurity excluding Si, O and H is $5\times10^{15}$ atoms/cm$^3$ or lower.

[H18] The n-type GaN crystal according to any one of [H1] to [H17], including a GaN crystal grown by HVPE.

[H19] The n-type GaN crystal according to any one of [H1] to [H18], which is a GaN wafer.

[H20] The n-type GaN crystal according to [H19], wherein a variation width of an x-direction component of an off-cut angle on a line extending in the x-direction through the center of a front surface and a variation width of a y-direction component of an off-cut angle on a line extending in the y-direction perpendicular to the x-direction through the center of the front surface are each 0.15° or less, 0.1° or less, or 0.08° or less, within a 40 mm-long section.

[H21] A method of producing an epitaxial wafer, the method including the steps of:

preparing the n-type GaN crystal according to [H19] or [H20]; and epitaxially growing at least one nitride semiconductor layer on the thus prepared n-type GaN crystal.

[H22] An epitaxial wafer, including:

the n-type GaN crystal according to [H19] or [H20]; and at least one nitride semiconductor layer epitaxially grown on the n-type GaN crystal.

[H23] A method of producing a nitride semiconductor device, the method including the steps of:

preparing the n-type GaN crystal according to [H19] or [H20]; and epitaxially growing at least one nitride semiconductor layer on the thus prepared n-type GaN crystal.

[H24] A method of producing a bilayer GaN wafer, the method including the steps of:

preparing a GaN wafer, which is the n-type GaN crystal according to any one of [H1] to [H8]; and epitaxially growing a GaN layer having a thickness of 20 μm or larger on a main surface of a Ga-polar side of the thus prepared GaN wafer, wherein a high-carrier-concentration region or a carrier compensation region is formed on the GaN layer, the high-carrier-concentration region is a region in which a lower limit of the carrier concentration is $1\times10^{18}$ cm$^{-3}$ or higher, and the carrier compensation region is a region in which a lower limit of a total concentration of compensating impurities is $2\times10^{17}$ atoms/cm$^3$ or higher.

[H25] The method according to [H24], wherein, in the epitaxial growth step, the GaN layer is grown by HVPE.

[H26] The method according to [H24] or [H25], wherein the GaN layer has a thickness of 500 μm or less.

[H27] The method according to any one of [H24] to [H26], wherein the high-carrier-concentration region is formed on the GaN layer, and the high-carrier-concentration region is a region in which the lower limit of the carrier concentration is $2\times10^{18}$ $cm^{-3}$ or higher, $3\times10^{18}$ $cm^{-3}$ or higher, or $4\times10^{18}$ $cm^{-3}$ or higher.

[H28] The method according to any one of [H24] to [H27], wherein the high-carrier-concentration region is formed on the GaN layer and doped with Ge.

[H29] The method according to any one of [H24] to [H28], wherein the high-carrier-concentration region is formed on the GaN layer and intentionally doped with Si.

[H30] The method according to [H24], wherein the carrier compensation region is formed on the GaN layer, and the carrier compensation region is a region in which the lower limit of the total concentration of compensating impurities is $5\times10^{17}$ atoms/$cm^3$ or higher, $1\times10^{18}$ atoms/$cm^3$ or higher, $2\times10^{18}$ atoms/$cm^3$ or higher, or $5\times10^{18}$ atoms/$cm^3$ or higher.

[H31] The method according to any one of [H24] to [H30], further including the step of thinning a laminate obtained in the epitaxial growth step.

[H32] A method of producing a bulk GaN crystal, the method including the steps of:

preparing a GaN wafer, which is the n-type GaN crystal according to any one of [H1] to [H8]; and epitaxially growing GaN on the thus prepared GaN wafer.

Effects of the Invention

According to one preferred embodiment, a GaN crystal which is grown by HVPE and has a (004) XRD rocking curve full width at half maximum of 20 arcsec or less is provided.

MODE FOR CARRYING OUT THE INVENTION

Figure 1:
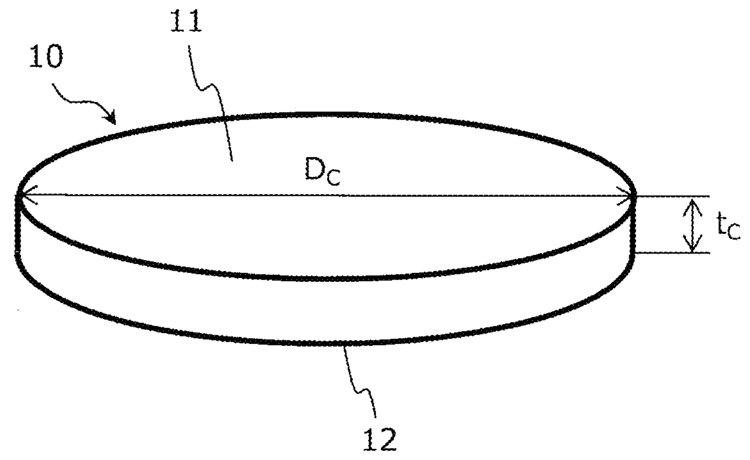
FIG. 1 is a perspective view that illustrates an n-type GaN crystal according to one embodiment.

In a GaN crystal, a (0001) crystal plane and a (000-1) crystal plane are collectively referred to as "c-plane", and a {10-10} crystal plane and a {11-20} crystal plane are referred to as "m-plane" and "a-plane", respectively. A crystallographic axis perpendicular to the c-plane is referred to as "c-axis", a crystallographic axis perpendicular to the m-plane is referred to as "m-axis", and a crystallographic axis perpendicular to the a-plane is referred to as "a-axis".

Hereinafter, unless otherwise specified, the terms "crystallographic axis", "crystal plane", "crystal orientation" and the like mean a crystallographic axis, a crystal plane, a crystal orientation and the like of a GaN crystal, respectively.

The Miller indices (hkil) of a hexagonal crystal has a relationship of h+k=−i and, therefore, may be expressed in three digits of (hkl). For example, (0004) is expressed as "(004)" in three digits.

The present invention will now be described based on its embodiments, referring to the drawings as appropriate.

1. n-Type GaN Crystal

1.1. Form and Dimensions

A crystal 10 illustrated in FIG. 1 is one example of an n-type GaN crystal according to one embodiment.

The crystal 10 has two main surfaces (large-area surfaces) facing the opposite directions from each other, namely a first main surface 11 and a second main surface 12. Either one of the first main surface 11 and the second main surface 12 has a Ga polarity, while the other has an N polarity. The first main surface 11 and the second main surface 12 are preferably parallel to each other.

When the first main surface 11 has a Ga polarity and the second main surface 12 has an N polarity, the inclination of the first main surface 11 with respect to the (0001) crystal plane is 0° to 10°. This inclination may be 0.2° or larger, and may be smaller than 5°, smaller than 2.5°, smaller than 2°, smaller than 1.5°, smaller than 1°, or smaller than 0.5°.

The inclination of the first main surface 11 with respect to the (0001) crystal plane is, in other words, an angle formed by the direction of the crystal 10 and the normal vector of the first main surface 11.

When the first main surface 11 has an N polarity and the second main surface 12 has a Ga polarity, the inclination of the first main surface 11 with respect to the (000-1) crystal plane is 0° to 10°. This inclination may be smaller than 5°, smaller than 2.5°, smaller than 2°, smaller than 1.5°, smaller than 1°, or smaller than 0.5°.

It is preferred that the first main surface 11 and the second main surface 12 each have an area of 3 $cm^2$ or larger.

The diameter Dc of the crystal 10 is usually 20 mm or larger, and may be 45 mm or larger, 95 mm or larger, or 145 mm or larger. The diameter Dc is typically, for example, 25 to 27 mm (about 1 inch), 50 to 55 mm (about 2 inches), 100 to 105 mm (about 4 inches), or 150 to 155 mm (about 6 inches).

The shapes of the first main surface 11 and the second main surface 12 are not restricted to be circular, and may be changed to any other shape, for example, a quadrangular shape such as a square or a rectangle, or a polygonal shape such as a regular hexagon or a regular octagon.

The crystal 10 may be an ingot or a wafer, or may be an epitaxial layer grown on other GaN crystal, a film pasted to a support substrate, or the like. In other words, the crystal 10 may or may not be self-supporting.

When the crystal 10 is an ingot, the thickness $t_c$ thereof is preferably 1.5 mm or greater, more preferably 2 mm or greater, still more preferably 3 mm or greater.

When the crystal 10 is a wafer, the thickness $t_c$ thereof can be, for example, 200 μm or greater but less than 500 μm, 500 μm or greater but less than 750 μm, 750 μm or greater but less than 1 mm, or 1 mm or greater but less than 2 mm.

When the crystal 10 is an epitaxial layer grown on other GaN crystal or a film pasted to a support substrate, the thickness $t_c$ thereof can be, for example, 5 μm or greater but less than 50 μm, 50 μm or greater but less than 100 μm, 100 μm or greater but less than 150 μm, or 150 μm greater but 250 μm or less.

1.2. Properties

The crystal 10 is composed of GaN grown by HVPE.

GaN grown by an ordinary HVPE apparatus equipped with a quartz reactor normally satisfies at least one condition selected from the following (a) to (c) regarding the impurity concentrations:

(a) the Si concentration is $5\times10^{16}$ atoms/$cm^3$ or higher;

(b) the O concentration is $3\times10^{16}$ atoms/$cm^3$ or lower; and (c) the H concentration is $1\times10^{17}$ atoms/$cm^3$ or lower.

The crystal 10 can satisfy all of the above-described conditions (a) to (c).

The crystal 10 is an n-type semiconductor containing donor impurities. In one example, the room-temperature resistivity (specific resistance at room temperature) of the crystal 10 is, but not limited to, lower than 0.03 Ω·cm, and can be preferably lower than 0.02 Ω·cm, more preferably lower than 0.015 Ω·cm, still more preferably lower than 0.010 Ω·cm.

Examples of donor impurities that may be contained in the crystal 10 include Group 14 elements such as Si (silicon) and Ge (germanium), and Group 16 elements such as O (oxygen) and S (sulfur).

A donor impurity contained in the crystal 10 at the highest concentration is preferably Si or Ge.

In one example, by controlling the total concentration of donor impurities excluding Si to be sufficiently lower than the Si concentration, the carrier concentration of the crystal 10 can be controlled through adjustment of the Si concentration. For this purpose, the total concentration of donor impurities excluding Si is preferably 10% or less, more preferably 5% or less, still more preferably 1% or less, of the Si concentration. When the total concentration of donor impurities excluding Si is 10% or less of the Si concentration, the carrier concentration of the crystal 10 can be 90% or more of the Si concentration.

When Ge is added to the crystal 10, it is effective to set the molar ratio of H2, which is contained in a carrier gas used for growth, to be relatively high for the purpose of reducing the concentration variation of Ge and, in association with this, the Si concentration of the crystal 10 can be in the order of $10^{17}$ atoms/$cm^3$ or higher.

In order to sufficiently reduce the resistivity of the crystal 10, the carrier concentration of the crystal 10 at room temperature is preferably $1\times10^{18}$ $cm^{-3}$ or higher, more preferably $2\times10^{18}$ $cm^{-3}$ or higher. The carrier concentration may be $3\times10^{18}$ $cm^{-3}$ or higher, or $4\times10^{18}$ $cm^{-3}$ or higher. From the standpoint of electrical characteristics, an upper limit of the carrier concentration is not particularly restricted; however, in order to prevent deterioration of the productivity of the crystal 10, the carrier concentration can be set at $1\times10^{19}$ $cm^{-3}$ or lower, and may be set at $8\times10^{18}$ $cm^{-3}$ or lower, or $5\times10^{18}$ $cm^{-3}$ or lower. This is because a high-concentration doping increases the occurrence of abnormal growth.

1.3. Crystal Quality

The quality of the crystal 10 can be evaluated using, as an index, the (004) XRD rocking curve FWHM measured by ω-scan with $CuK\alpha_1$ radiation. The better the crystal quality, the narrower is the (004) XRD rocking curve FWHM.

In the measurement of (004) XRD rocking curve, an X-ray tube is operated at a voltage of 45 kV and a current of 40 mA, and $Cuk_\alpha$ radiation monochromatized using a Ge (440) 4-crystal symmetrical monochromator is directed into the first main surface 11. The incident direction of X-ray with the first main surface 11 is not particularly restricted and, for example, the X-ray incident plane may be perpendicular to the a-axis.

The X-ray beam size is set such that, when the angle of incidence (angle formed by a reflection plane and X-ray) is 90°, i.e. when an X-ray is allowed to enter perpendicular to the (004) plane that is the reflection plane, the irradiated area on the first main surface 11 has a size of 5 mm in the direction parallel to the ω-axis and 1 mm in the direction perpendicular to the ω-axis. The term "ω-axis" used herein refers to the rotation axis of a sample in the rocking curve measurement.

When the X-ray beam size is set as described above, the value of ω is about 36.5° in the (004) XRD rocking curve measurement of GaN; therefore, the size of the irradiated area on the first main surface 11 is about 1.7×5 $mm^2$.

The (004) XRD rocking curve FWHM measured in this manner may be less than 20 arcsec, less than 18 arcsec, less than 16 arcsec, less than 14 arcsec, or less than 12 arcsec.

Figure 2:
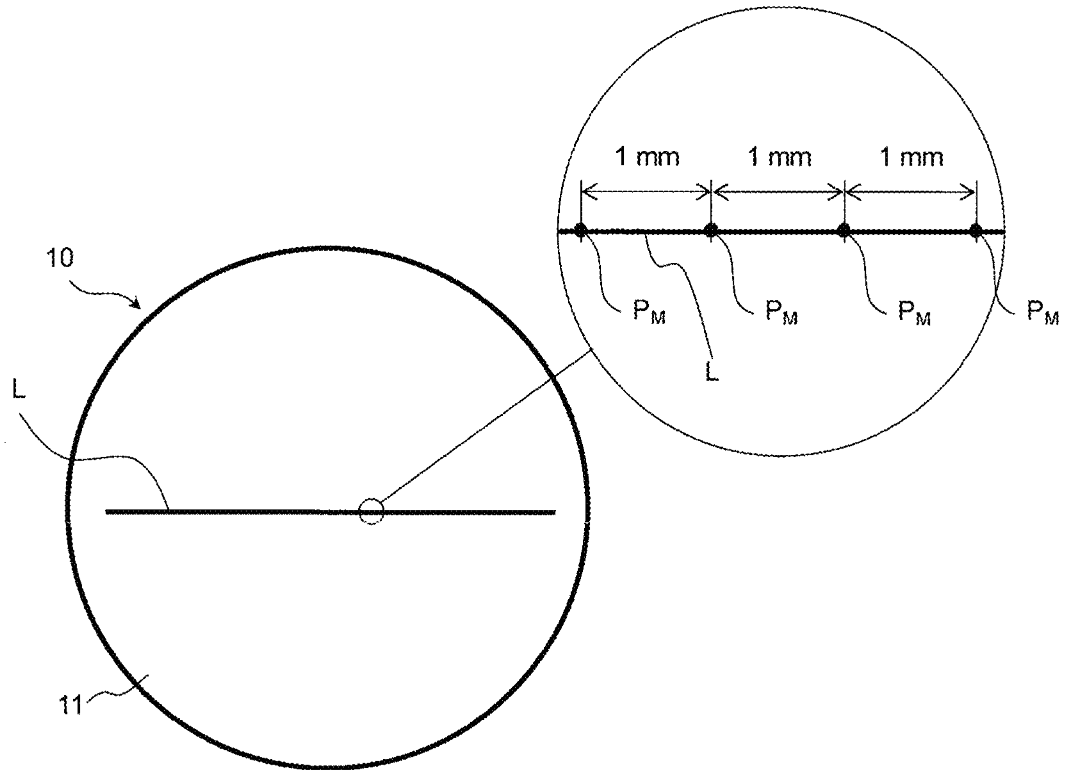
FIG. 2 is a plan view that illustrates the n-type GaN crystal according to one embodiment.

When the first main surface 11 has a diameter of larger than 40 mm, as illustrated in FIG. 2, by performing ω-scan under the above-described conditions along a single line L on the first main surface 11 over a length of 40 mm at 1-mm intervals, a (004) XRD rocking curve can be obtained at 40 measurement points $P_M$ that are aligned at a pitch of 1 mm on the line L. In this case, the ω-axis is perpendicular to the line L in the ω-scan performed at each measurement point $P_M$. In other words, an X-ray is allowed to enter the crystal 10 such that the X-ray incident plane and the line L are parallel to each other.

In a preferred example, when the above-described measurement is performed along at least one line on the first main surface 11, the maximum value of the (004) XRD rocking curve FWHM among all measurement points can be 20 arcsec or less.

The average value of the (004) XRD rocking curve FWHM among all measurement points may be 18 arcsec or less, 16 arcsec or less, 14 arcsec or less, 12 arcsec or less, or 10 arcsec or less.

Figure 3:
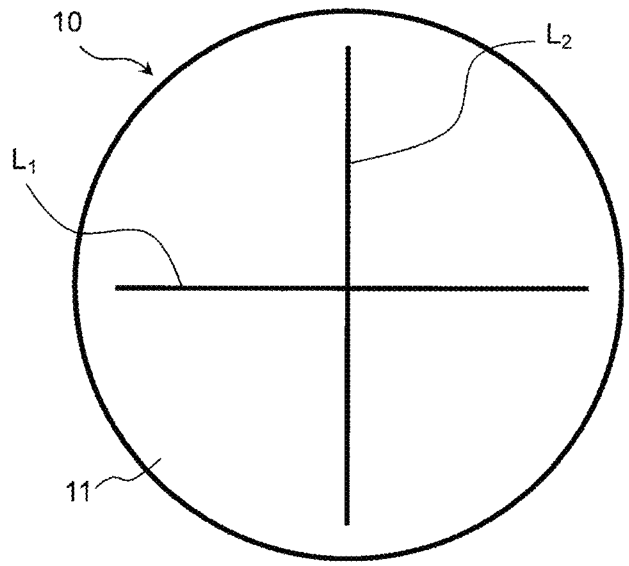
FIG. 3 is another plan view that illustrates the n-type GaN crystal according to one embodiment.

When the first main surface 11 has a diameter of larger than 40 mm, by further performing ω-scan under the above-described conditions along each of two lines $L_1$ and $L_2$, which are perpendicular to one another as illustrated in FIG. 3, on the first main surface 11 over a length of 40 mm at 1-mm intervals, a (004) XRD rocking curve can be obtained at 40 measurement points that are aligned at a pitch of 1 mm on the respective lines $L_1$ and $L_2$. In this case, the ω-axis in the ω-scan performed at each measurement point on the line $L_1$ is perpendicular to the line $L_1$, and the ω-axis in the ω-scan performed at each measurement point on the line $L_2$ is perpendicular to the line $L_2$.

In a preferred example, when the above-described measurement is performed along each of at least two lines perpendicular to one another on the first main surface 11, the maximum value of the (004) XRD rocking curve FWHM among all measurement points on each line can be 20 arcsec or less. In other words, the maximum value among the 40 measurement points on one of the two lines and the maximum value among the 40 measurement points on the other line can both be 20 arcsec or less.

The average value of the (004) XRD rocking curve FWHM among all measurement points on each line may be 18 arcsec or less, 16 arcsec or less, 14 arcsec or less, 12 arcsec or less, or 10 arcsec or less.

From the crystal 10, at least one X-ray anomalous transmission image having a square area of 10 mm×10 mm can be obtained in X-ray topography by the Lang method.

In the Lang method, an X-ray source is arranged on the side of one of the main surfaces of a plate-form test piece, and an X-ray detector is arranged on the side of the other main surface.

Anomalous transmission of X-ray, which is referred to as "the Borrmann effect", is a phenomenon that an X-ray is transmitted through a crystal which is normally too thick for the X-ray to transmit therethrough due to absorption. For example, when a transmission image is obtained from a 344 μm-thick GaN crystal in X-ray topography using Mokα (wavelength=0.71073 Å) as the X-ray source, the obtained image is an anomalous transmission image. This is because, since the absorption coefficient μ of GaN is 290.40 $cm^{-1}$ when the X-ray source is Mokα and the value of μ·t is 10.0 (μ·t=10.0) when the wafer thickness t is 344 μm, a transmission image cannot be obtained under a condition of μ·t≥10 without anomalous transmission.

Anomalous transmission is not observed when the crystal integrity is low; therefore, a GaN crystal that yields an anomalous transmission image in X-ray topography can be considered to have a good quality.

The crystal 10 yields preferably at least one X-ray anomalous transmission image having a square area of 15 mm 15 mm, more preferably at least one X-ray anomalous transmission image having a square area of 20 mm×20 mm.

2. GaN Wafer

In the present specification, a GaN wafer having an off-cut of 10° or smaller from the (0001) crystal plane or the (000-1) crystal plane is referred to as "c-plane GaN wafer".

2.1. Form and Dimensions

Figure 4:
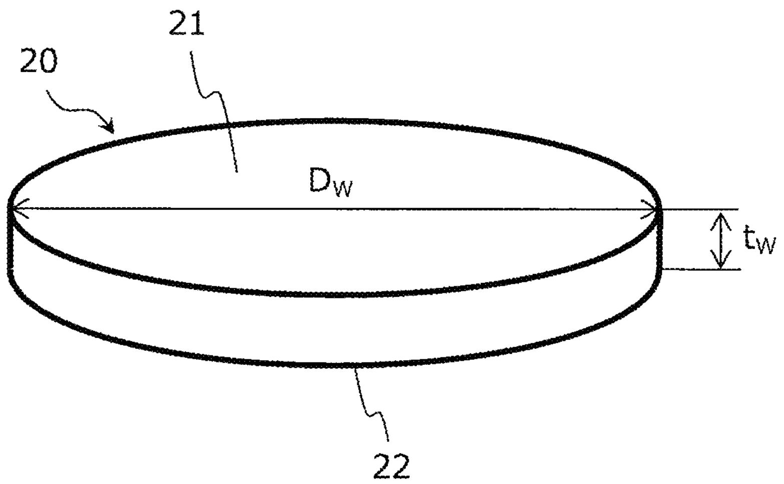
FIG. 4 is a perspective view that illustrates a GaN wafer according to one embodiment.

A wafer 20 illustrated in FIG. 4 is one example of a GaN wafer according to one embodiment.

The wafer 20 is a c-plane GaN wafer, and one of its two main surfaces (large-area surfaces) facing the opposite directions from each other, namely a first main surface 21 and a second main surface 22, has a Ga polarity, while the other has an N polarity. The main surface on the Ga-polar side may be referred to as "Ga-polar surface", and the main surface on the N-polar side may be referred to as "N-polar surface".

When the first main surface 21 has a Ga polarity, the inclination of the first main surface 21 with respect to the (0001) crystal plane is 0° to 10°. This inclination may be 0.2° or larger, and may be smaller than 5°, smaller than 2.5°, smaller than 1.5°, smaller than 1°, or smaller than 0.5°.

When the first main surface 21 has an N polarity, the inclination of the first main surface 21 with respect to the (000-1) crystal plane is 0° to 10°. This inclination may be smaller than 5°, smaller than 2.5°, smaller than 1.5°, smaller than 1°, or smaller than 0.5°.

The first main surface 21 and the second main surface 22 are preferably parallel to each other.

The diameter $D_W$ of the wafer 20 is usually 45 mm or larger, and may be 95 mm or larger, or 145 mm or larger. The diameter $D_W$ of the wafer 20 is typically, for example, 50 to 55 mm (about 2 inches), 100 to 105 mm (about 4 inches), or 150 to 155 mm (about 6 inches).

The thickness $t_W$ of the wafer 20 is designed in accordance with the diameter $D_W$ such that the wafer 20 can be self-supporting and handled. For example, when the diameter $D_W$ of the wafer 20 is about 2 inches, the thickness $t_W$ is preferably 250 to 500 μm, more preferably 300 to 450 μm and, when the diameter $D_W$ of the wafer 20 is about 4 inches, the thickness $t_W$ is preferably 400 to 800 μm, more preferably 500 to 650 μm. When the diameter $D_W$ of the wafer 20 is about 6 inches, the thickness $t_W$ is preferably 500 to 850 μm, more preferably 600 to 750 μm.

Figure 15:
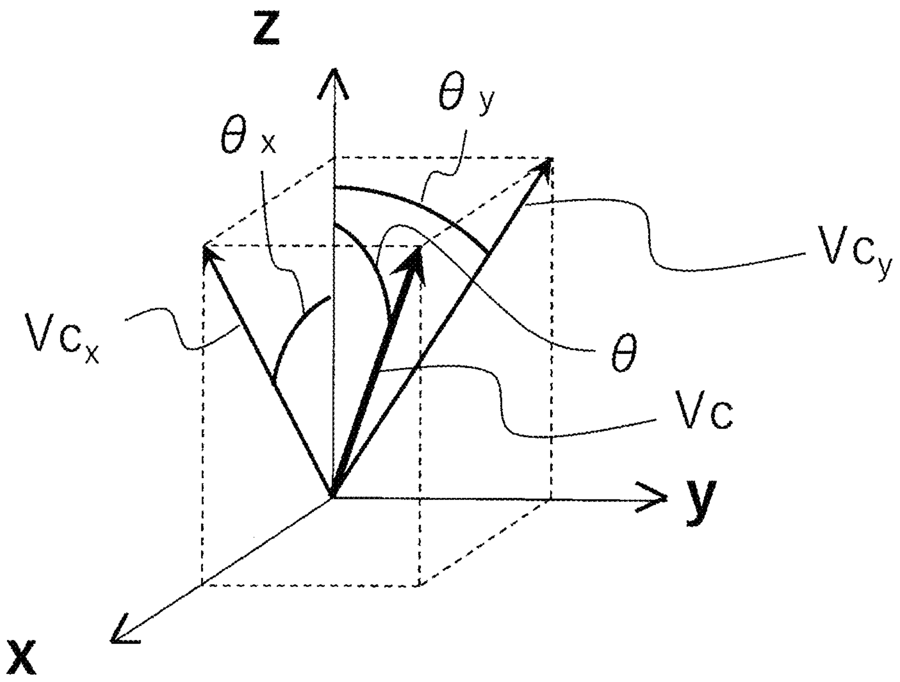
FIG. 15 is a drawing for describing that an off-cut angle of a c-plane GaN wafer can be decomposed into two directional components perpendicular to each other.

The off-cut angle of the wafer 20 can be decomposed into two directional components, namely an x-direction component and a y-direction component, which are perpendicular to each other in the first main surface 21. Referring to FIG. 15, when the normal direction of the first main surface 21 is the z-direction and the vector parallel to the c-axis is "vector Vc", the off-cut angle of the wafer 20 is equal to an inclination θ of the vector Vc from the z-axis. This vector Vc can be decomposed into a vector $Vc_x$ which is an x-direction component, and a vector $Vc_y$ which is an y-direction component. An orthogonal projection of the vector Vc on the x-z plane is the vector $Vc_x$, and an orthogonal projection of the vector Vc on the y-z plane is the vector $Vc_y$.

When the vector Vc is decomposed in this manner, the inclination of the vector $Vc_x$ from the z-axis is an x-direction component θx of the off-cut angle θ, and the inclination of the vector $Vc_y$ from the z-axis is an y-direction component θy of the off-cut angle θ.

In the wafer 20, a variation width of the x-direction component of the off-cut angle on a line extending in the x-direction through the center of the first main surface 21 and a variation width of the y-direction component of the off-cut angle on a line extending in the y-direction through the center of the first main surface 21 can each be 0.15° or ° or less, preferably 0.1° or less, more preferably 0.08° less, within a 40 mm-long section. In this evaluation, a portion of less than 5 mm in distance from the outer circumference in a plan view of the wafer 20 may be excluded.

The term "variation width" used herein refers to a difference between a maximum value and a minimum value and, for example, a variation width of 0.15° or less means that, in other words, a variation from a median value is within ±0.075°.

The x-direction may be parallel to one of the a-planes and, in this case, the y-direction is parallel to one of the m-planes.

The first main surface 21 of the wafer 20 is a main surface, namely "front surface", which is expected to be used for the epitaxial growth of a nitride semiconductor in the production of, for example, a nitride semiconductor device using the wafer 20 as a substrate. The first main surface 21 is mirror-finished, and the root-mean-square (RMS) roughness thereof, which is measured by AFM, is preferably less than 2 nm, and may be less than 1 nm or less than 0.5 nm, in a measurement area of 2 μm×2 μm.

The second main surface 22 is a "back surface", and may be mirror-finished or mat-finished.

The edges of the wafer 20 may be chamfered as well.

The wafer 20 may be provided with various markings as required, such as an orientation flat or notch that indicates the crystal orientation, and an index flat that facilitates identification of the front surface and the back surface.

The wafer 20 has circular main surfaces; however, the shapes of the main surfaces are not restricted to be circular, and may be changed to any other shape, such as a square, a rectangle, a hexagon, or an octagon.

2.2. Properties

The wafer 20 includes a GaN crystal grown by HVPE.

GaN grown by an ordinary HVPE apparatus equipped with a quartz reactor normally satisfies at least one condition selected from the following (a) to (c) regarding the impurity concentrations:

(a) the Si concentration is $5\times10^{16}$ atoms/cm$^3$ or higher;

(b) the O concentration is $3\times10^{16}$ atoms/cm$^3$ or lower; and (c) the H concentration is $1\times10^{17}$ atoms/cm$^3$ or lower.

The wafer 20 can satisfy all of the above-described conditions (a) to (c).

For reference, GaN grown by HVPE can be distinguished from GaN grown by an ammonothermal method in that an absorption peak with an absorption coefficient of higher than 0.5 cm$^{-1}$ is not observed in a range of 3,150 to 3,250 cm$^{-1}$ of the far-infrared absorption spectrum of the former GaN. This far-infrared absorption peak is attributed to gallium vacancies contained at a high concentration in GaN grown by an ammonothermal method [S. Suihkonen, et al., Applied Physics Letters 108, 202105 (2016); and W. Jiang, et al., Applied Physics Express 10, 075506 (2017)].

Intentional doping of the wafer 20 can be performed as desired. Accordingly, in one example, the wafer 20 may be formed from only GaN that is not intentionally doped (UID-GaN; un-intentionally doped GaN). The conductivity type of UID-GaN is an n-type since unintentional donor impurity doping and generation of nitrogen vacancies inevitably occur.

In UID-GaN, the Si concentration can be $5\times10^{17}$ atoms/cm$^3$ or lower, the O concentration can be $3\times10^{16}$ atoms/cm$^3$ or lower, $2\times10^{16}$ atoms/cm$^3$ or lower, or $1\times10^{16}$ atoms/cm$^3$ or lower, and the concentration of each impurity excluding Si, O and H can be $5\times10^{15}$ atoms/cm$^3$ or lower.

UID-GaN may have a carrier concentration of lower than $5\times10^{17}$ cm$^{-3}$ and a room-temperature resistivity of 0.04 Ω·cm or higher.

In one example, by intentional doping, the room-temperature resistivity of the wafer 20 can be reduced to lower than 0.03 Ω·cm, lower than 0.02 Ω·cm, lower than 0.015 Ω·cm, or lower than 0.010 Ω·cm. In order to sufficiently reduce the resistivity, the carrier concentration of the wafer 20 at room temperature is preferably $1\times10^{18}$ cm$^{-3}$ or higher, more preferably $2\times10^{18}$ cm$^{-3}$ or higher. The carrier concentration may be $3\times10^{18}$ cm$^{-3}$ or higher, or $4\times10^{18}$ cm$^{-3}$ or higher. From the standpoint of electrical characteristics, an upper limit of the carrier concentration is not particularly restricted; however, in order to prevent deterioration of the productivity of the wafer 20, the carrier concentration can be set at $1\times10^{19}$ cm$^{-3}$ or lower, and may be set at $8\times10^{18}$ cm$^{-3}$ or lower, or $5\times10^{18}$ cm$^{-3}$ or lower. This is because a high-concentration doping increases the occurrence of abnormal growth of a GaN crystal.

A dopant to be added to the wafer 20 for reduction of the resistivity is preferably a donor impurity; therefore, the conductivity type of the wafer 20 is preferably an n-type when the resistivity is reduced by doping. This is because a donor impurity generally exhibits a higher activation rate than an acceptor impurity. The "activation rate" is a ratio of the carrier concentration with respect to the concentration of a dopant in doped GaN.

Examples of elements that can act as a donor impurity include Group 14 elements such as Si (silicon) and Ge (germanium), and Group 16 elements such as O (oxygen) and S (sulfur).

When doped with donor impurities, the donor impurity contained in the wafer 20 at the highest concentration is preferably Si or Ge, and this is because of the following two main reasons.

First, Si and Ge are donor impurities having a high activation rate, along with O.

Secondly, facet growth is required for obtaining GaN highly doped with O; however, GaN highly doped with Si or Ge can be obtained by c-plane growth.

Facet growth is a technique for growing a [0001]-oriented GaN film such that its growth surface is covered with pits. In contrast, c-plane growth refers to growing the GaN film such that its growth surface is flat.

Threading dislocations have a property of being concentrated on the bottom of pits; therefore, a GaN film formed by facet growth has a heterogeneous distribution of threading dislocations. The manufacturers of nitride semiconductor devices often do not prefer a c-plane GaN wafer cut out from such a GaN film.

A GaN crystal having a (004) XRD rocking curve FWHM of 20 arcsec or less has a low density of threading dislocations; therefore, its growth surface in c-plane growth under appropriate conditions can be flat and have an extremely favorable morphology with no hillock. Si and Ge are considered to be donor impurities that can take advantage of this feature.

In one preferred example, by controlling the total concentration of donor impurities excluding Si to be sufficiently lower than the Si concentration, the carrier concentration of the wafer 20 can be controlled through adjustment of the Si concentration. For this purpose, the total concentration of donor impurities excluding Si is preferably 10% or less, more preferably 5% or less, still more preferably 18 or less, of the Si concentration. When the total concentration of donor impurities excluding Si is 10% or less of the Si concentration, the carrier concentration of the wafer 20 can be 90% or more of the Si concentration.

When Ge is intentionally added to the wafer 20, it is effective to set the molar ratio of H2, which is contained in a carrier gas used for growth, to be relatively high for the purpose of reducing the concentration variation of Ge and, in association with this, the Si concentration of the wafer 20 can be in the order of $10^{17}$ atoms/cm$^3$ or higher even without an intentional addition of Si.

In one mode, only a portion of the wafer 20 may be intentionally doped.

Figure 5:
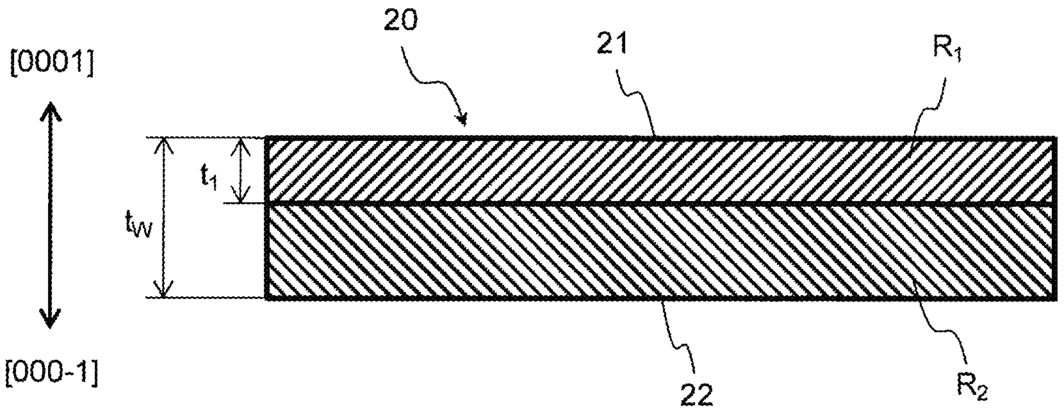
FIG. 5 is a cross-sectional view that illustrates the GaN wafer according to one embodiment.

In the example illustrated in FIG. 5, the wafer 20 has a first region $R_1$ composed of intentionally-doped GaN (ID-GaN) on the Ga-polar first main surface 21 side, and a second region $R_2$ composed of UID-GaN on the N-polar second main surface 22 side. The first region $R_1$ has a higher carrier concentration and a lower resistivity than the second region $R_2$.

Between the first region $R_1$ and the second region $R_2$, an intermediate region (not illustrated) having an intermediate carrier concentration of these two regions may be arranged. In this intermediate region, the carrier concentration may increase in a continuous or stepwise manner from the N-polar side toward the Ga-polar side.

The thickness $t_1$ of the first region $R_1$ can be, for example, 5 μm or greater but less than 50 μm, 50 μm or greater but less than 100 μm, 100 μm or greater but less than 150 μm, or 150 μm greater but 250 μm or less.

A regrowth interface may exist between the first region $R_1$ and the second region $R_2$. In other words, the wafer 20 illustrated in FIG. 5 may be produced through the steps of completing a c-plane GaN wafer composed of UID-GaN and subsequently growing an ID-GaN layer on the Ga-polar main surface side of the c-plane GaN wafer by HVPE.

In the wafer 20 illustrated in FIG. 5, the room-temperature resistivity in the first region $R_1$ can be less than 0.03 Ω·cm, less than 0.02 Ω·cm, less than 0.015 Ω·cm, or less than 0.010 Ω·cm. In the first region $R_1$, the carrier concentration at room temperature is preferably $1\times10^{18}$ cm$^{-3}$ or higher, more preferably $2\times10^{18}$ cm$^{-3}$ or higher, and may be $3\times10^{18}$ cm$^{-3}$ or higher, or $4\times10^{18}$ cm$^{-3}$ or higher.

An intentional dopant contained in the first region $R_1$ is preferably a donor impurity and, in this case, the donor impurity contained in the first region $R_1$ at the highest concentration is Si or Ge. In a preferred example, the total concentration of donor impurities excluding Si in the first region $R_1$ can be 10% or less, 5% or less, or 1% or less, of the Si concentration.

In the second region $R_2$, the Si concentration can be $5\times10^{17}$ atoms/cm$^3$ or lower, the O concentration can be $3\times10^{16}$ atoms/cm$^3$ or lower, $2\times10^{16}$ atoms/cm$^3$ or lower, or $1\times10^{16}$ atoms/cm$^3$ or lower, and the concentration of each impurity excluding Si, O and H can be $5\times10^{15}$ atoms/cm$^3$ or lower.

In the second region $R_2$, the carrier concentration can be lower than $5\times10^{17}$ and the room-temperature resistivity can be 0.04 Ω·cm or higher.

2.3. Crystal Quality

The quality of the wafer 20 can be evaluated using, as an index, the (004) XRD rocking curve FWHM measured by ω-scan with Cukor radiation. The better the crystal quality, the narrower is the (004) XRD rocking curve FWHM.

In the measurement of (004) XRD rocking curve, an X-ray tube is operated at a voltage of 45 kV and a current of 40 mA, and $CuK_\alpha$ radiation monochromatized using a Ge (440) 4-crystal symmetrical monochromator is directed into the first main surface 21.

The X-ray beam size is set such that, when the angle of incidence (angle formed by a reflection plane and X-ray) is 90°, i.e. when an X-ray is allowed to enter perpendicular to the (004) plane that is the reflection plane, the irradiated area on the first main surface 21 has a size of 5 mm in the direction parallel to the ω-axis and 1 mm in the direction perpendicular to the ω-axis. The term "ω-axis" used herein refers to the rotation axis of a sample in the rocking curve measurement.

When the X-ray beam size is set as described above, the value of ω is about 36.5° in the (004) XRD rocking curve measurement of GaN; therefore, the irradiated area on the first main surface 21 is about 1.7×5 mm$^2$.

Figure 6:
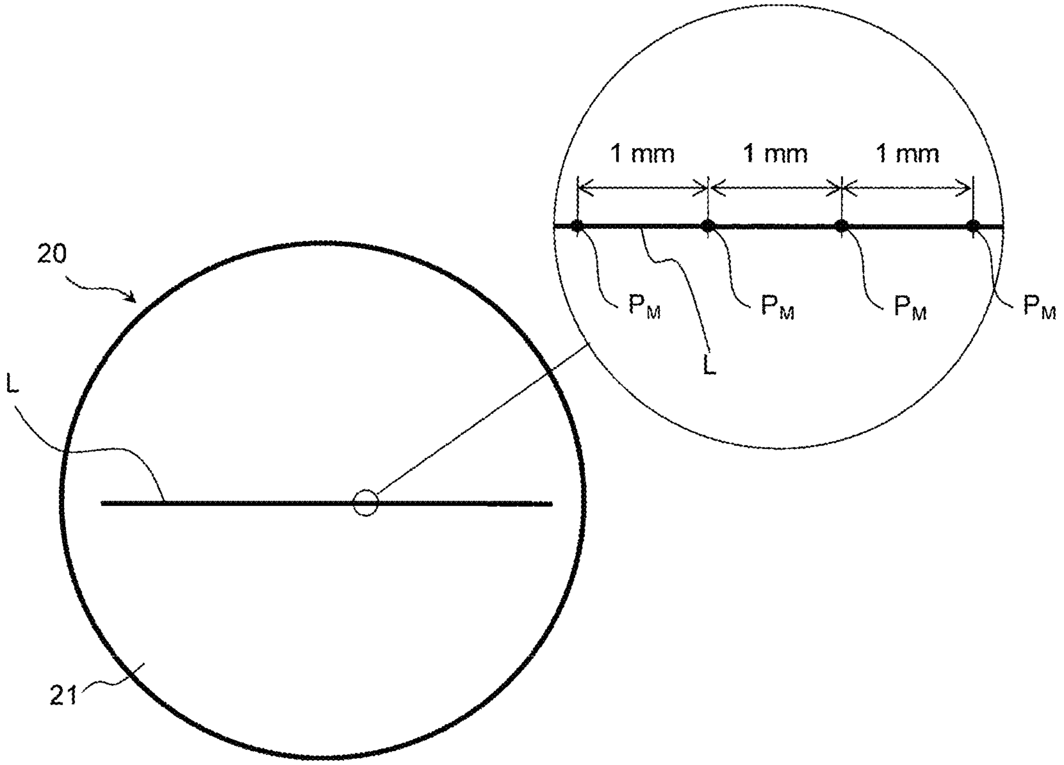
FIG. 6 is a plan view that illustrates the GaN wafer according to one embodiment.

As illustrated in FIG. 6, by performing a ω-scan along a single line L on the first main surface 21 of the wafer 20 over a length of 40 mm at 1-mm intervals, a (004) XRD rocking curve can be obtained at 40 measurement points $P_M$ that are aligned at a pitch of 1 mm on the line L. In the ω-scan performed at each measurement point $P_M$, the ω-axis is perpendicular to the line L. In other words, an X-ray is allowed to enter the wafer 20 such that the X-ray incident plane and the line L are parallel to each other.

In the wafer 20, when the above-described measurement is performed along at least one line on the first main surface 21, the maximum value of the (004) XRD rocking curve FWHM among all measurement points is 20 arcsec or less.

The average value of the (004) XRD rocking curve FWHM among all measurement points can be 18 arcsec or less, 16 arcsec or less, 14 arcsec or less, 12 arcsec or less, or 10 arcsec or less.

Figure 7:
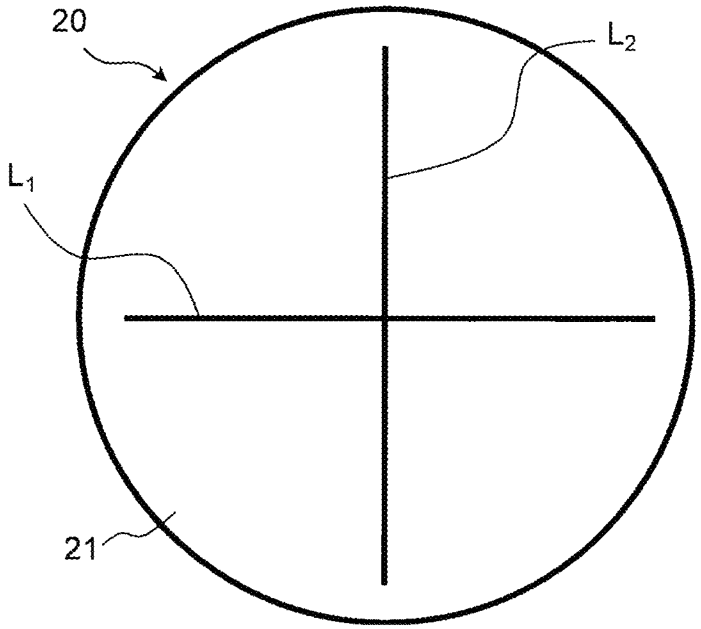
FIG. 7 is another plan view that illustrates the GaN wafer according to one embodiment.

Further, on the first main surface 21 of the wafer 20, by performing ω-scan under the above-described conditions along each of two lines $L_1$ and $L_2$, which are perpendicular to one another as illustrated in FIG. 7, over a length of 40 mm at 1-mm intervals, a (004) XRD rocking curve can be obtained at 40 measurement points that are aligned at a pitch of 1 mm on the respective lines $L_1$ and $L_2$. In this case, the ω-axis in the ω-scan performed at each measurement point on the line $L_1$ is perpendicular to the line $L_1$, and the ω-axis in the ω-scan performed at each measurement point on the line $L_2$ is perpendicular to the line $L_2$.

In a preferred example, when the above-described measurement is performed along each of at least two lines perpendicular to one another on the first main surface 21, the maximum value of the (004) XRD rocking curve FWHM among all measurement points on each line can be 20 arcsec or less. In other words, the maximum value among the 40 measurement points on one of the two lines and the maximum value among the 40 measurement points on the other line can both be 20 arcsec or less.

The average value of the (004) XRD rocking curve FWHM among all measurement points on each line may be 18 arcsec or less, 16 arcsec or less, 14 arcsec or less, 12 arcsec or less, or 10 arcsec or less.

On the first main surface 21 of the wafer 20, the dislocation density can be preferably $2\times10^5$ cm$^{-2}$ or lower, more preferably $1\times10^5$ cm$^{-2}$ or lower, still more preferably $5\times10^4$ cm$^{-2}$ or lower. In the evaluation of the dislocation density, a portion of less than 5 mm in distance from the outer circumference in a plan view of the wafer 20 may be excluded.

2.4. Use

The wafer 20 can be preferably used as a substrate in the production of various nitride semiconductor devices.

The term “nitride semiconductor device” used herein refers to a semiconductor device in which a major part of the device structure is constituted by a nitride semiconductor. A nitride semiconductor is also called “nitride-based Group III-V compound semiconductor”, “Group III nitride-based compound semiconductor”, “GaN-based semiconductor” or the like, and contains GaN along with a compound in which gallium of GaN is partially or entirely substituted with other Periodic Table Group 13 element (e.g., B, A1, or In).

Representative examples of a nitride semiconductor device that can be produced using the wafer 20 include, but not limited to: light-emitting devices, such as light-emitting diodes (LEDs) and laser diodes (LDs); and electronic devices, such as rectifiers, bipolar transistors, field-effect transistors, and HEMTs (High-Electron Mobility Transistors).

In the production of a nitride semiconductor device, one or more nitride semiconductor layers are epitaxially grown on the first main surface 21 of the wafer 20 to form an epitaxial wafer having a semiconductor device structure. Preferred examples of an epitaxial growth method include, but not limited to: vapor-phase methods such as MOCVD, MBE, pulsed vapor deposition, sputtering, and HVPE.

After the thus formed epitaxial wafer is subjected to a semiconductor processing that may include etching, ion implantation, and addition of structures such as an electrode and a protective film, the epitaxial wafer is thinned as required and subsequently divided into nitride semiconductor device chips. In this thinning process, the second main surface 22 side of the wafer 20 is ground, polished, and/or etched.

When the wafer 20 consists of only UID-GaN, usually, no electrode is formed on the surface of the wafer 20. In one example, after an epitaxial wafer is formed using the wafer 20 consisting of only UID-GaN, the wafer 20 may be entirely removed from the thus formed epitaxial wafer by grinding, polishing, and/or etching.

When the wafer 20 includes a first region $R_1$ formed by ID-GaN on the first main surface 21 side and a second region $R_2$ formed by UID-GaN on the second main surface 22 side as illustrated in FIG. 5, in one example, after an epitaxial wafer is formed using the wafer 20, the second region $R_2$ is removed from the wafer 20 by grinding, polishing and/or etching, and an electrode may be formed on the thus exposed surface of the first region $R_1$.

When the wafer 20 consists of only ID-GaN, in one example, after an epitaxial wafer is formed using the wafer 20, an electrode may be formed on the second main surface 22 of the wafer 20. The formation of this electrode can be performed after the step of thinning the epitaxial wafer.

The wafer 20 can also be used as a material that constitutes a part of a bilayer GaN wafer.

Figure 8:
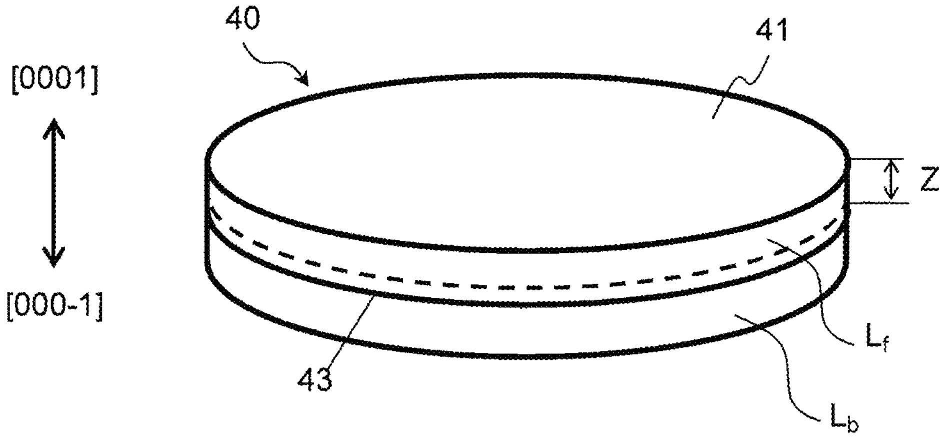
FIG. 8 is a perspective view that illustrates one example of a bilayer GaN wafer.

A bilayer wafer 40 illustrated in FIG. 8, which is one example of a bilayer GaN wafer, has a back layer $L_b$ composed of at least a part of the wafer 20, and a front layer $L_f$ composed of GaN epitaxially grown on the main surface of the Ga-polar side of the wafer 20. A regrowth interface 43 exists between the front layer $L_f$ and the back layer $L_b$.

Similarly to the wafer 20, the bilayer wafer 40 is expected to be used as a substrate in the production of a nitride semiconductor device. Accordingly, the thickness of the bilayer wafer 40 is, as in the case of an ordinary GaN wafer: preferably 250 to 500 μm, more preferably 300 to 450 μm, when the diameter is about 2 inches; preferably 400 to 800 μm, more preferably 500 to 650 μm, when the diameter is about 4 inches; or preferably 500 to 850 μm, more preferably 600 to 750 μm, when the diameter is about 6 inches.

The thickness of the front layer $L_f$ is preferably uniform; however, this is not required. In the bilayer wafer 40, when the regrowth interface 43 is inclined with respect to a main surface 41 of the Ga-polar side, the thickness of the front layer $L_f$ varies along the direction of the inclination. The minimum thickness of the front layer $L_f$, namely the thickness at the thinnest spot, is at least 20 μm, preferably 50 μm or greater, and may be, for example, 75 μm or greater, or 100 μm or greater.

When the thickness of the bilayer wafer 40 is greater than 300 μm, the maximum thickness of the front layer $L_f$, namely the thickness at the thickest spot, is preferably 300 μm or less, more preferably 250 μm or less, still more preferably 200 μm or less.

A difference between the maximum thickness and the minimum thickness of the front layer $L_f$ is 200 μm or less, preferably 100 μm or less, more preferably 50 μm or less, still more preferably 25 μm or less, yet still more preferably 10 μm or less.

In the front layer $L_f$, at least a portion within a distance of 5 μm from an upper surface is contained in a high-carrier-concentration region or a carrier compensation region. The upper surface of the front layer $L_f$ is, in other words, the main surface 41 on the Ga-polar side of the bilayer wafer 40.

In a preferred example, a portion of the front layer $L_f$ within a distance Z from the upper surface is contained in a high-carrier-concentration region or a carrier compensation region. The distance Z can be 20 μm or greater but less than 50 μm, 50 μm or greater but less than 100 μm, 100 μm or greater but less than 150 μm, or 150 μm greater but 250 μm or less, as long as it is not greater than the minimum thickness of the front layer $L_f$.

The high-carrier-concentration region is a region in which a lower limit of the carrier concentration is $1\times10^{18}$ $cm^{-3}$ or higher. The high-carrier-concentration region may be a region in which the lower limit of the carrier concentration is $2\times10^{18}$ $cm^{-3}$ or higher, $3\times10^{18}$ $cm^{-3}$ or higher, or $4\times10^{18}$ $cm^{-3}$ or higher.

Donor impurities preferably added to the high-carrier-concentration region are Si and Ge.

The high-carrier-concentration region may be a region in which the lower limit of the carrier concentration is $4\times10^{18}$ $cm^{-3}$ or higher and a lower limit of a total concentration of the donor impurities is $5\times10^{18}$ atoms/$cm^3$ or higher, $6\times10^{18}$ atoms/$cm^3$ or higher, or $8\times10^{18}$ atoms/$cm^3$ or higher.

In order to avoid a marked reduction in the crystal quality, the total concentration of the donor impurities in the high-carrier-concentration region can be $5\times10^{19}$ atoms/$cm^3$ or lower, $2\times10^{19}$ atoms/$cm^3$ or lower, or $1\times10^{19}$ atoms/$cm^3$ or lower.

In the high-carrier-concentration region, a variation in the carrier concentration along the c-axis direction is preferably within ±25%, more preferably within ±20%, still more preferably within ±15%, yet still more preferably within ±10%, from a median value. When it is difficult to measure the carrier concentration, this may be substituted with the total concentration of the donor impurities.

The carrier compensation region is a region in which a lower limit of a total concentration of compensating impurities is $2\times10^{17}$ atoms/$cm^3$ or higher. The carrier compensation region may be a region in which the lower limit of the total concentration of compensating impurities is $5\times10^{17}$ atoms/$cm^3$ or higher, $1\times10^{18}$ atoms/$cm^3$ or higher, $2\times10^{18}$ atoms/$cm^3$ or higher, or $5\times10^{18}$ atoms/$cm^3$ or higher.

The compensating impurities are impurities that have a function of compensating an n-type carrier in a GaN crystal. Preferred compensating impurities are C (carbon) and transition metal elements, and preferred examples of the transition metal elements include Fe (iron), Mn (manganese), Co (cobalt), Cr (chromium), V (vanadium), Ni (nickel), and Cu (copper).

In order to avoid a marked reduction in the crystal quality, the total concentration of the compensating impurities in the carrier compensation region can be $5\times10^{19}$ atoms/cm$^3$ or lower, $2\times10^{19}$ atoms/cm$^3$ or lower, or $1\times10^{19}$ atoms/cm$^3$ or lower.

In the carrier compensation region, a variation in the total concentration of the compensating impurities along the c-axis direction is preferably within ±25%, more preferably within ±20%, still more preferably within ±15%, yet still more preferably within ±10%, from a median value.

In the production of the bilayer wafer 40, the wafer 20 is prepared first, and a GaN layer is subsequently epitaxially grown on the main surface of the Ga-polar side of the wafer 20 to obtain a laminate. The wafer 20 preferably consists of only UID-GaN.

A method of growing the GaN layer is not restricted and may be MOCVD; however, HVPE is preferably employed. The growth thickness of the GaN layer is preferably 500 μm or less. The high-carrier-concentration region or the carrier compensation region is formed by intentionally doping at least a portion of the GaN layer.

The thinning step of thinning a laminate obtained by the growth of the GaN layer is adopted as required. In the thinning step, either or both of the N-polar side of the wafer 20 and the Ga-polar side of the GaN layer is/are ground, polished, and/or etched.

The bilayer wafer 40 may have the intentionally-doped high-carrier-concentration region or carrier compensation region only in the front layer $L_f$; however, in terms of the function as a substrate for the production of a nitride semiconductor device, the bilayer wafer 40 is not inferior to a GaN wafer that is intentionally doped entirely. This is because the production process of a nitride semiconductor device generally includes the step of thinning an epitaxial wafer, and a GaN wafer used as a substrate is processed from its back side in this step, as a result of which a considerable portion thereof is removed.

In the bilayer wafer 40, even if the back layer $L_b$ is completely removed in the production process of a nitride semiconductor device, the minimum thickness of the front layer $L_f$ is controlled to be at least 20 μm, preferably 50 μm or greater, such that the remaining front layer $L_f$ can play a role as a substrate that supports the structure of nitride semiconductor device chips.

In addition to the above, the wafer 20 can also be used as a seed wafer for growing a bulk GaN crystal by HVPE, THVPE (Tri-Halide Vapor Phase Epitaxy), OVPE (Oxide Vapor Phase Epitaxy), an ammonothermal method, a Na flux method, or other method. The wafer 20 consisting of only UID-GaN is particularly suitable for this use.

3. Method of Growing GaN Crystal

A method of growing a GaN crystal, which can be preferably employed for the production of an n-type GaN crystal or a GaN wafer according to one embodiment or in the method of producing a GaN wafer according to one embodiment, will now be described.

3.1. HVPE Apparatus

Figure 9:
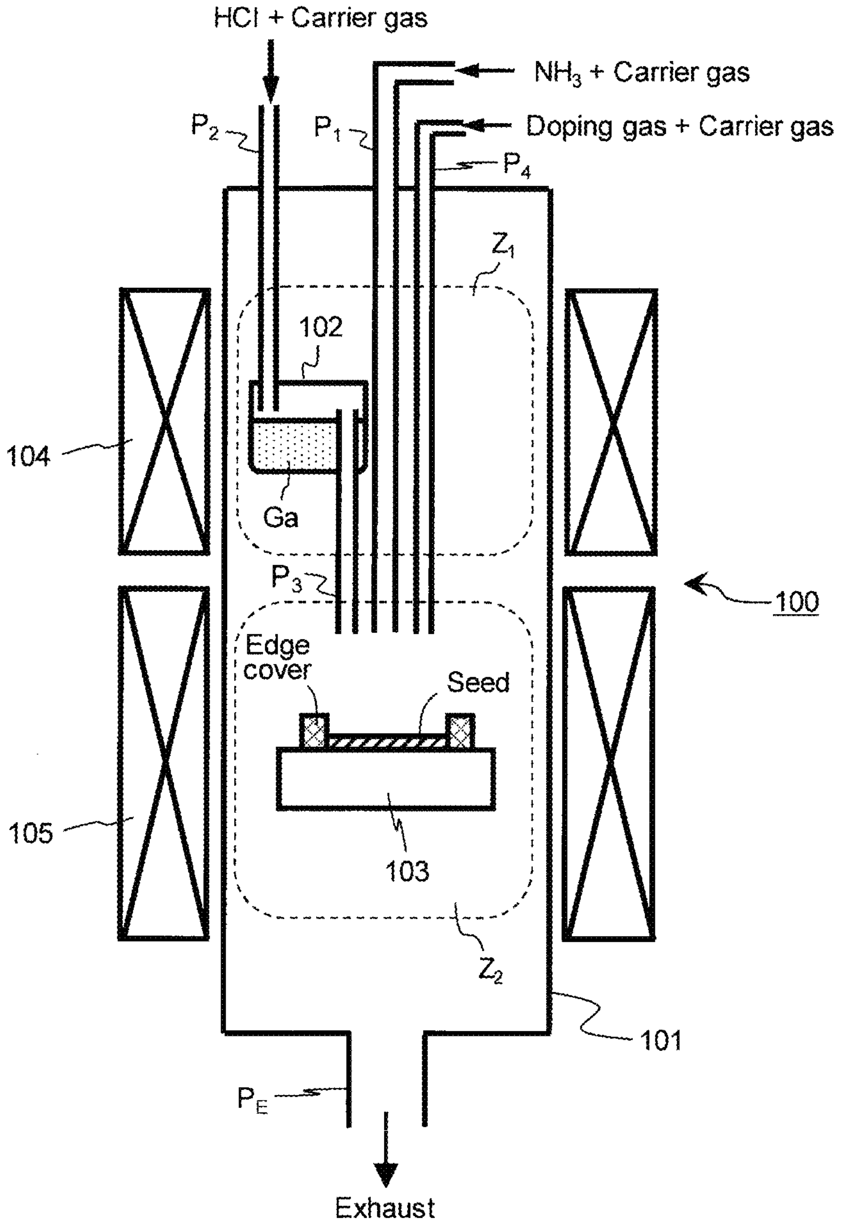
FIG. 9 is a schematic drawing that illustrates a basic configuration of an HVPE apparatus.

FIG. 9 illustrates a basic configuration of an HVPE apparatus which can be used for the production of an n-type GaN crystal or a GaN wafer according to one embodiment or in the method of producing a GaN wafer according to one embodiment.

Referring to FIG. 9, an HVPE apparatus 100 includes: a hot wall-type reactor 101; a gallium reservoir 102 and a susceptor 103, which are arranged inside the reactor; and a first heater 104 and a second heater 105, which are arranged on the outside of the reactor. The first heater 104 and the second heater 105 each circularly surround the reactor 101.

The reactor 101 is a quartz tube chamber. In the reactor 101, there are a first zone $Z_1$ which is mainly heated by the first heater 104, and a second zone $Z_2$ which is mainly heated by the second heater 105. An exhaust pipe PE is connected to a reactor end on the side of the second zone $Z_2$.

The gallium reservoir 102 arranged in the first zone $Z_1$ is a quartz container having a gas inlet and a gas outlet.

The susceptor 103 arranged in the second zone $Z_2$ is formed of, for example, a graphite. A mechanism for rotating the susceptor 103 may be arranged as desired.

On the susceptor 103, a seed is arranged.

Figure 10A:
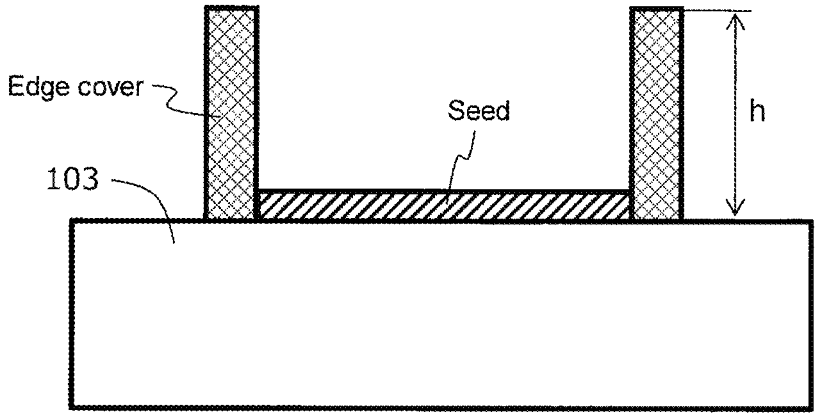
FIG. 10A is a cross-sectional view illustrating a state where a seed and an edge cover are set on a susceptor.

Preferably, as illustrated in FIG. 10A, an edge cover which covers the edge of the seed is arranged on the susceptor along with the seed.

Figure 10B:
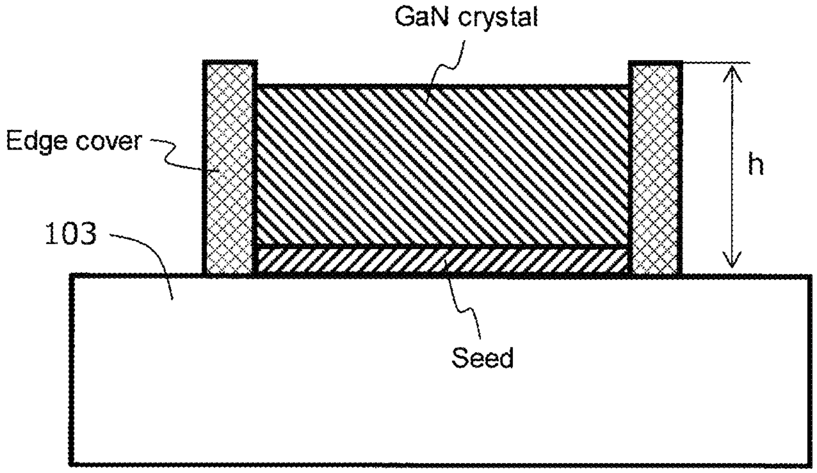
FIG. 10B is a cross-sectional view illustrating a state where a GaN crystal has been grown on the seed illustrated in FIG. 10A.

The edge cover is formed of, for example, a graphite, and the height h thereof is set such that, as illustrated in FIG. 10B, the upper surface of a thick GaN film to be grown on the seed will not be positioned above the upper end of the edge cover at the completion of the growth.

Figure 11:
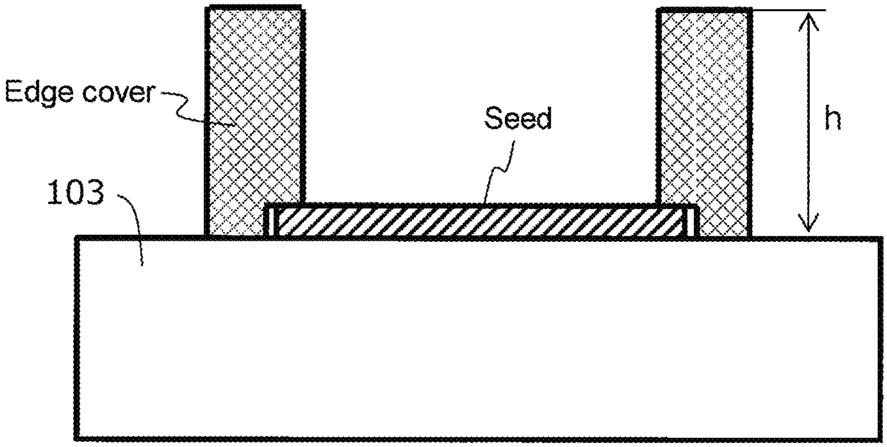
FIG. 11 is a cross-sectional view illustrating a state where a seed and an edge cover are set on a susceptor.

As illustrated in FIG. 11, the edge cover may also cover the outer periphery of the seed main surface in addition to the edge of the seed.

When a thick GaN crystal film is to be grown on a large-area seed, the role of the edge cover is important.

Based on the experiences of the present inventors, when a circular GaN wafer of 2 inches in diameter was used as a seed, it was indispensable to use an edge cover in order to grow a GaN layer, which had a thickness from which a wafer could be cut out, in such a manner that the GaN layer was not damaged.

On the other hand, when a GaN wafer with a rectangular main surface having a larger surface area than a circle of 2 inches in diameter was used as a seed, it was possible even without an edge cover to grow a GaN layer, which had a thickness from which a wafer could be cut out, in such a manner that the GaN layer was not damaged. Nevertheless, a thick GaN film grown without an edge cover had a poor surface morphology. Not only a ridge protruding in the c-axis direction was formed along the outer edge, but also large-sized pits were densely generated on the inner wall surface of the ridge, and fine cracks were observed on the surface of the ridge. When this thick GaN film was sliced along the c-plane, cracks extending along the center part from the edge were generated, and a desired wafer could not be obtained.

Referring back to FIG. 9, when growing a GaN crystal, the inside of the reactor 101 is heated by the first heater 104 and the second heater 105. In addition, $NH_3$ (ammonia) diluted with a carrier gas is supplied to the second zone $Z_2$ through an ammonia introduction pipe $P_1$, and HCl (hydrogen chloride) diluted with a carrier gas is supplied to the gallium reservoir 102 through a hydrogen chloride introduction pipe $P_2$. This HCl reacts with gallium metal contained in the gallium reservoir 102, and the resulting GaCl (gallium chloride) is transferred to the second zone $Z_2$ through a gallium chloride introduction pipe $P_3$. In the second zone $Z_2$, $NH_3$ and GaCl react with each other, and the resulting GaN is crystallized on the seed placed on the susceptor 103.

When the GaN crystal grown on the seed is doped with an impurity, a doping gas diluted with a carrier gas is introduced to the second zone $Z_2$ in the reactor 101 through a dopant introduction pipe $P_4$.

With regard to the ammonia introduction pipe $P_1$, the hydrogen chloride introduction pipe $P_2$, the gallium chloride introduction pipe $P_3$, and the dopant introduction pipe $P_4$, their parts that are arranged inside the reactor 101 can be formed of quartz.

In FIG. 9, the distance from a nozzle to the susceptor 103 is the same for the ammonia introduction pipe $P_1$ and the gallium chloride introduction pipe $P_3$; however, the configuration is not restricted to this, and the opening of the nozzle of the ammonia introduction pipe $P_1$ may be positioned farther away from the susceptor 103 (on the upstream side) than the opening of the nozzle of the gallium chloride introduction pipe $P_3$.

Alternatively, the nozzle of the ammonia introduction pipe $P_1$ and the nozzle of the gallium chloride introduction pipe $P_3$, which are independent from each other in FIG. 9, may be integrated into a double-pipe nozzle in which the former is an outer pipe and the latter is an inner pipe.

In FIG. 9, the nozzle of the gallium chloride introduction pipe $P_3$ and the nozzle of the dopant introduction pipe $P_4$ are illustrated to be independent from each other; however, the configuration is not restricted to this. For example, in order to uniformly dope the GaN crystal to be grown, the opening of the nozzle of the dopant introduction pipe $P_4$ may be positioned inside the gallium chloride introduction pipe $P_3$ such that GaCl and the doping gas are mixed and then released into the second zone $Z_2$ through a common nozzle.

When doping the GaN crystal to be grown with Si, $SiH_4$ (silane), $SiH_3Cl$ (monochlorosilane), $SiH_2Cl_2$ (dichlorosilane), $SiHCl_3$ (trichlorosilane) or $SiCl_4$ (tetrachlorosilane) can be preferably used as the doping gas.

When doping the GaN crystal to be grown with Ge, $GeH_4$ (germane), $GeH_3Cl$ (monochlorogermane), $GeH_2Cl_2$ (dichlorogermane), $GeHCl_3$ (trichlorogermane) or $GeCl_4$ (tetrachlorogermane) can be preferably used as the doping gas.

The GaN crystal to be grown may contain 0 and Si despite not being intentionally doped. Probably, unintended Si originates from quartz constituting the reactor or the pipes, and unintended O originates from either or both of such quartz and water entering into the reactor from the outside.

Including those components omitted in FIG. 9, the components arranged inside the reactor 101 can be formed of, for example, SiC (silicon carbide), $SiN_x$ (silicon nitride), BN (boron nitride), alumina, W (tungsten) and Mo (molybdenum), in addition to quartz and carbon. This enables to control the concentration of each impurity excluding Si, O and H in the GaN crystal grown on the seed to be $5\times10^{15}$ atoms/cm$^3$ or lower, unless the GaN crystal is intentionally doped.

3.2. Seed

One preferred example of the seed used for the growth of an n-type GaN crystal or a GaN wafer according to one embodiment is a c-plane GaN wafer grown by an acid ammonothermal method using $NH_4F$ and $NH_4I$ as mineralizers and, with regard to a production method thereof, a reference can be made to the above-mentioned Patent Document 1 (WO2018/030311A1).

This c-plane GaN wafer often has an oxygen concentration in the order of mid-$10^{18}$ atoms/cm$^3$ or higher; however, on its main surface of the Ga-polar side, a GaN crystal having an oxygen concentration of $3\times10^{16}$ atoms/cm$^3$ or lower can be grown by HVPE with hardly any strain.

The inclination of this main surface with respect to the (0001) crystal plane is in a range of preferably 0° to 1°, more preferably 0° to 0.5°.

3.3. Growth Conditions

The conditions preferred for growing a GaN crystal on the seed by HVPE are as follows.

The temperature of the gallium reservoir is, for example, 500 to 1,000° C., preferably 700° C. or higher, but preferably 900° C. or lower.

The temperature of the susceptor is, for example, 900 to 1,100° C., preferably 930° C. or higher, more preferably 950° C. or higher, but preferably 1,050° C. or lower, more preferably 1,020° C. or lower.

A V/III ratio, which is a ratio between the $NH_3$ partial pressure and the GaCl partial pressure in the reactor, for example, can be 1 to 20; however, it is preferably 2 or higher, more preferably 3 or higher, but preferably 10 or lower.

An excessively high or low V/III ratio causes deterioration of the surface morphology of GaN to be grown. Deterioration of the surface morphology causes a reduction in the crystal quality and an increase in the concentration of oxygen that is unintentionally incorporated into the resulting GaN crystal.

Depending on the impurity, the efficiency of incorporation into a GaN crystal may be strongly dependent on the orientation of a facet exposed on the GaN surface during the growth. The uniformity of the concentration of such an impurity is low inside a GaN crystal not having a good surface morphology during the growth, and this is because facets having various orientations exist on the surface having a poor morphology.

A typical example of such an impurity is O (oxygen); however, the present inventors found the same tendency for Ge (germanium) as well. As described below, the point that an excessive reduction in the $H_2$ molar ratio in the carrier gas is not preferable for the growth of a GaN crystal intentionally doped with Ge relates to this finding.

In addition, an excessively low V/III ratio causes an increase in the nitrogen vacancy concentration in the GaN crystal to be grown. The effects of nitrogen vacancies on a GaN wafer or a nitride semiconductor device formed on a GaN wafer are not clear at present; however, since nitrogen vacancies are point defects, it is believed that the concentration thereof should be as low as possible.

The growth rate of a GaN crystal can be controlled using the product of the $NH_3$ partial pressure and the GaCl partial pressure in the reactor as a parameter. The growth rate is, for example, 20 to 200 μm/h, preferably 30 μm/h or higher, more preferably 40 μm/h or higher, but preferably 120 μm/h or lower, more preferably 100 μm/h or lower, still more preferably 80 μm/h or lower.

The present inventors found that, when a GaN crystal is grown by HVPE on a seed having a high crystal quality that is composed of a GaN crystal grown by an acidic ammonothermal method, an excessively low growth rate causes a problem that a region in which the growth is locally stopped is formed on the growth surface.

By adopting a low growth rate of 20 μm/h to 50 μm/h, the generation of a new threading dislocation at the interface between a seed composed of a GaN crystal grown by an acidic ammonothermal method and a GaN crystal growing on the seed by HVPE can be preferably inhibited.

In order to improve the production efficiency, the growth rate may be increased in the middle of the growth. Experiments conducted by the present inventors indicated that, when the growth rate was initially set at 40 μm/h and was increased to 80 μm/h or 120 μm/h in the middle of the growth, the threading dislocation density of a GaN crystal grown at 80 μm/h was not different from that of a seed composed of a GaN crystal grown by an acidic ammonothermal method, and the threading dislocation density of a GaN crystal grown at 120 μm/h was twice the threading dislocation density of the seed at the highest.

When the growth rate is increased, it should be done within a range that does not deteriorate the surface morphology of the GaN crystal to be grown. Problems that can occur due to deterioration of the surface morphology are as described above.

As a carrier gas used for diluting each of $NH_3$, HCl and the doping gas, $H_2$ (hydrogen gas), No (nitrogen gas), or a mixed gas of $H_2$ and $N_2$ can be preferably used.

The molar ratio of $H_2$ in the carrier gas has an effect on the impurity concentrations of the GaN crystal to be grown. The molar ratio of $H_2$ in the carrier gas is calculated based on the flow rates of the respective gas species supplied as the carrier gas from the outside of the reactor into the reactor.

For reference, Table 1 below shows the results of investigating how the impurity concentrations of Si-doped GaN and Ge-doped GaN, which were grown by HVPE using the same V/III ratio at substantially the same growth rate on a Ga-polar surface of a c-plane GaN wafer cut out from a GaN crystal grown on a sapphire substrate by HVPE, were changed by the molar ratio of $H_2$ in a carrier gas. As a doping gas, $SiH_2Cl_2$ was used for Si doping, and $GeCl_4$ was used for Ge doping.

TABLE 1

| | Concentration of Si-doped GaN [atoms/cm$^3$] | | Concentration of Ge-doped GaN [atoms/cm$^3$] | | DL |
|---|---|---|---|---|---|
| Impurity | $H_2$ Molar ratio = 0 | $H_2$ Molar ratio = 0.7 | $H_2$ Molar ratio = 0 | $H_2$ Molar ratio = 0.7 | (Detection limit) [atoms/cm$^3$] |
| Si | $8 \times 10^{17}$ | $2 \times 10^{18}$ | $7 \times 10^{16}$ | $4 \times 10^{17}$ | $7 \times 10^{14}$ |
| Ge | <DL | <DL | $1 \times 10^{19}$ | $6 \times 10^{17}$ | $1 \times 10^{15}$ |
| O | $6 \times 10^{16}$ | $8 \times 10^{15}$ | $2 \times 10^{17}$ | $1 \times 10^{16}$ | $5 \times 10^{15}$ |
| H | $4 \times 10^{16}$ | <DL | $7 \times 10^{16}$ | <DL | $3 \times 10^{16}$ |
| C | <DL | <DL | <DL | <DL | $3 \times 10^{15}$ |
| Cl | <DL | <DL | <DL | <DL | $2 \times 10^{14}$ |

As seen from Table 1, the O concentration of an Si-doped GaN crystal can be 10% or less of the Si concentration when the molar ratio of $H_2$ in the carrier gas is 0 (zero). Since O is substantially the only donor impurity other than Si, this is equivalent to that the total concentration of donor impurities excluding Si is 10% or less of the Si concentration. The O concentration of Si-doped GaN is further reduced as the molar ratio of $H_2$ in the carrier gas is increased, and the O concentration can be less than 1% of the Si concentration when the molar ratio of $H_2$ is 0.7.

On the other hand, in a Ge-doped GaN crystal, when the molar ratio of $H_2$ in the carrier gas is 0 (zero), the Ge concentration is at least 10 times higher and the ratio of the Ge concentration with respect to the Si concentration is also higher as compared to when the molar ratio of $H_2$ is 0.7. Accordingly, a lower molar ratio of $H_2$ in the carrier gas appears to be more preferred at a glance; however, this is not always the case.

As seen from the result that the O concentration was also one digit higher when the molar ratio of $H_2$ in the carrier gas was 0 (zero) as compared to when the molar ratio was 0.7, the present inventors confirmed that the surface morphology of GaN during the growth was poor at the molar ratio of 0, and that the high Ge concentration was also caused by the poor surface morphology.

O and Ge are both donor impurities; therefore, a problem of a reduction in the uniformity of the carrier concentration may occur in a GaN crystal grown under a condition where the molar ratio of $H_2$ in the carrier gas is excessively low.

Therefore, when performing Ge doping, the molar ratio of $H_2$ in the carrier gas is preferably about 0.3 to 0.7. In a Ge-doped GaN crystal grown under this condition, the Si concentration is $4\times10^{17}$ atoms/cm$^3$ or higher when the Ge concentration is $1\times10^{18}$ atoms/cm$^3$ or higher.

Regardless of whether a GaN crystal grown by HVPE is doped with Si or Ge, the O concentration of the GaN crystal tends to be reduced by increasing the molar ratio of $H_2$ in the carrier gas, and can be $2\times10^{16}$ atoms/cm$^3$ or lower, or $1\times10^{16}$ atoms/cm$^3$ or lower. This is believed to be attributed to an improvement in the surface morphology of the GaN crystal during the growth.

The crystal quality of a c-plane GaN wafer used as a seed also affects the surface morphology of a GaN crystal grown thereon. A GaN crystal having a lower O concentration can be grown on a seed a higher quality.

When a GaN crystal is grown on a seed, the doping gas may be supplied from the beginning; however, it is preferred to start the supply of the doping gas once the thickness of a growing GaN layer has reached at least 10 μm. In addition, it is preferred to gradually increase the supply rate of the doping gas to a prescribed value over a period of several minutes to several ten minutes from the start of the supply.

4. Experimental Results

Experiments conducted by the present inventors will now be described.

Figure 12:
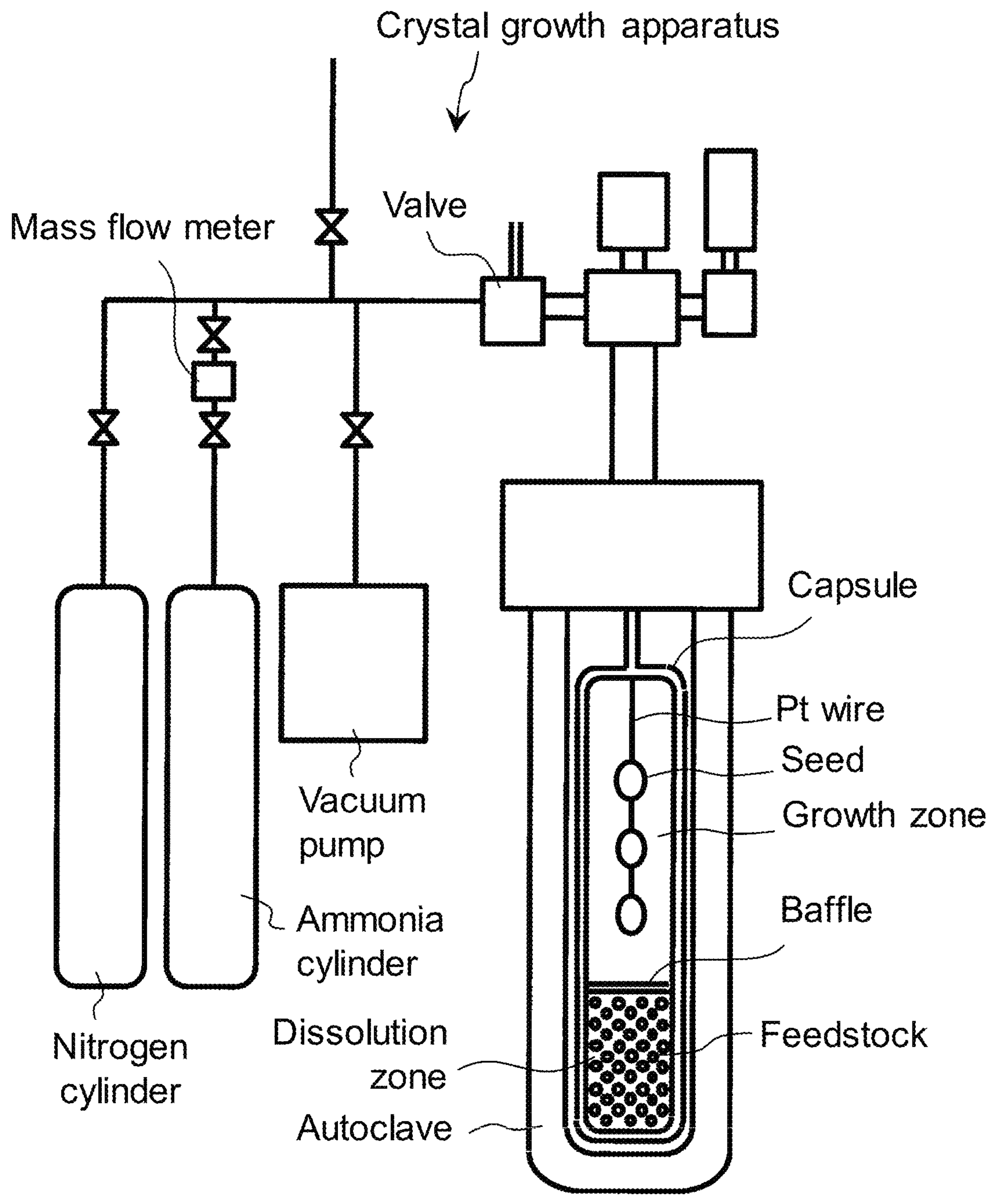
FIG. 12 is a drawing that illustrates a basic configuration of a crystal growth apparatus used for growing a GaN crystal by an ammonothermal method.

In the experiments, a crystal growth apparatus having the basic configuration illustrated in FIG. 12 was used for growing a GaN crystal by an ammonothermal method. This crystal growth apparatus is provided with an autoclave, and a capsule which is made of a Pt—Ir alloy and arranged inside the autoclave. The capsule includes therein a dissolution zone and a growth zone which are partitioned from each other by a baffle made of Pt. When growing a GaN crystal, a feedstock is placed in the dissolution zone along with a mineralizer (not illustrated), and a seed is suspended by a Pt wire in the growth zone.

A gas line to which a vacuum pump, an ammonia cylinder, and a nitrogen cylinder are connected is connected to the autoclave and the capsule via a valve. When $NH_3$ (ammonia) is introduced into the capsule, the amount of $NH_3$ supplied from the ammonia cylinder can be checked by a mass flow meter.

The pressure inside the capsule upon heating of the capsule to a prescribed temperature is determined in accordance with the amount of $NH_3$ introduced into the capsule. $NH_3$ is entrapped not only inside the capsule but also in the space between the autoclave and the capsule such that the pressure is balanced between the inside and the outside of the capsule.

Once the seed, the feedstock and the mineralizer are set and the introduction of $NH_3$ is completed, the capsule is hermetically sealed and then heated by heaters (not illustrated) from the outside of the autoclave such that a supercritical state is established inside the capsule. In order to create a temperature gradient between the dissolution zone and the growth zone, the upper part and the lower part of the autoclave are separately heated by plural heaters.

4.1. Experiment 1

(1) Seed Preparation

A first c-plane GaN wafer having a thickness of 0.4 mm, which was grown by an ammonothermal method using $NH_4F$ and $NH_4I$ as mineralizers, was prepared.

On the mirror-finished N-polar surface of this first c-plane GaN wafer, a stripe-patterned selective growth mask, which was made of a sputtered film having a bilayer structure in which a 100 nm-thick Pt surface layer was laminated on a 100 nm-thick TiW underlayer, was formed by a lift-off method. The linear openings formed on the selective growth mask had a line width of 50 μm, and the pitch between the linear openings was 2 mm. The stripe direction was parallel to the a-plane of the GaN crystal constituting the wafer.

A GaN crystal was grown by an ammonothermal method using, as a seed, the first c-plane GaN wafer having the selective growth mask formed on the N-polar surface.

In this ammonothermal process, a polycrystalline GaN was used as a feedstock, and $NH_4F$ and $NH_4I$ were used as mineralizers.

The polycrystalline GaN was produced by a method in which HCl gas was brought into contact with simple Ga under heating to generate gaseous GaCl, and this gaseous GaCl was subsequently allowed to react with $NH_3$ gas.

As for the amount of the added mineralizers, $NH_4F$ and $NH_4I$ were each added at a molar ratio of 1.0% with respect to an $NH_3$ solvent. The $NH_4I$ mineralizer was synthesized by allowing HI (hydrogen iodide) gas and $NH_3$ to react with each other in the Pt—Ir capsule serving as a reaction vessel.

Figure 13:
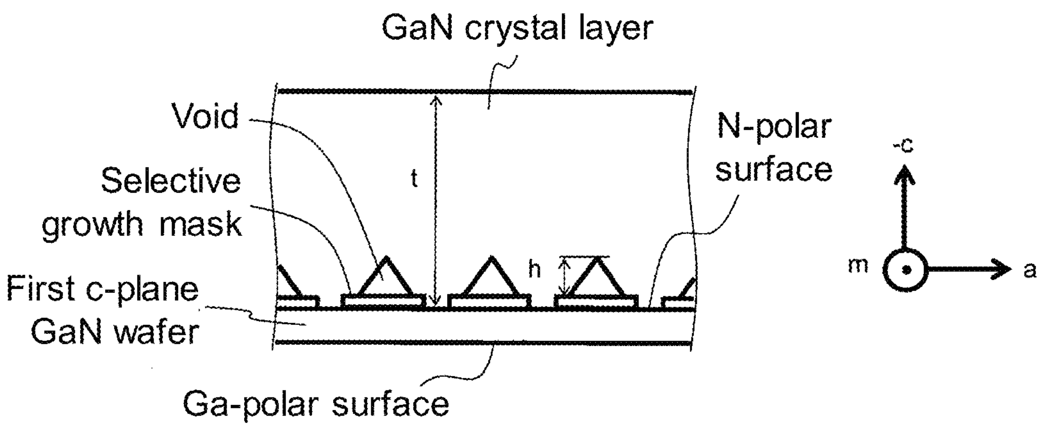
FIG. 13 is a cross-sectional view illustrating a state where a GaN crystal layer has been grown by an ammonothermal method on a N-polar surface of a first c-plane GaN wafer.

In the ammonothermal process, the temperature $T_1$ of the dissolution zone and the temperature $T_2$ of the growth zone were set at an average value of 600° C. to 620° C.; the temperature difference between these zones, $T_1$-$T_2$ ($T_1$>$T_2$), was set at 5° C. to 10° C.; and the capsule inner pressure was set at 200 MPa to 230 MPa. These conditions were maintained for at least 30 days. On the N-polar surface of the first c-plane GaN wafer, as illustrated in FIG. 13, a GaN crystal was grown to form a layer, and the thickness t thereof was 3 mm. Voids were formed in the parts adjacent to the selective growth mask, and the height h of the respective voids, namely the distance from the upper surface of the selective growth mask to the top of each void, was 0.5 mm to 1 mm. It should be noted here that a GaN crystal was also grown on the Ga-polar surface of the first c-plane GaN wafer; however, this is not illustrated in FIG. 13.

Next, a second c-plane GaN wafer having a thickness of 0.4 mm was formed by processing the thus grown GaN crystal layer. A Ga-polar surface of the second c-plane GaN wafer was mirror-finished and planarized by grinding, and subsequently finished by CMP for removing a damaged layer.

A value of less than 10 arcsec was obtained when the full width at half maximum of a (004) XRD rocking curve was measured for a c-plane GaN wafer produced by the same method as this second c-plane GaN wafer.

(2) Production of Ge-Doped c-Plane GaN Wafer

Using a c-plane GaN wafer which was obtained by dividing the above-described second c-plane GaN wafer and had a Ga-polar surface area of about 7 $cm^2$ and a thickness of 0.4 mm as a seed, a thick GaN film was grown by HVPE on the Ga-polar surface of the c-plane GaN wafer using a vapor-phase growth apparatus having a basic configuration common to that of the HVPE apparatus illustrated in FIG. 9. The procedures were generally as follows.

First, the seed was set on the susceptor. An edge cover was not used.

Next, while supplying $N_2$, $H_2$ and $NH_3$ into the reactor such that their partial pressures were 0.25 atom, 0.73 atom and 0.02 atom, respectively, the reactor was heated using heaters arranged on the outside of the reactor.

After the susceptor temperature reached 1,002° C., the susceptor temperature was maintained constant to allow GaN to grow. The temperature of the Ga reservoir was set at 800° C. The carrier gas supplied into the reactor contained 69% of $H_2$ in terms of molar ratio, and the remainder was $N_2$.

During a period of 60 minutes immediately after the start of the growth, GaCl and $NH_3$ were supplied into the reactor to partial pressures of $7.7\times10^{-3}$ atm and $2.3\times10^{-2}$ atm, respectively, and no doping gas was intentionally supplied.

Supply of $GeCl_4$ (tetrachlorogermane) into the reactor was initiated 60 minutes after the start of the growth. The supply rate of $GeCl_4$ was gradually increased over a period of 5 minutes.

Once the supply rate of $GeCl_4$ reached a prescribed value, GaCl, $NH_3$ and $GeCl_4$ were supplied into the reactor such that their partial pressures were $7.7\times10^{-3}$ atm, $2.3\times10^{-2}$ atm and $1.7\times10^{-7}$ atm, respectively, whereby a Ge-doped thick GaN film was grown to about 2.7 mm.

From the thickness and the growth time, the growth rate of the Ge-doped thick GaN film was calculated to be about 33 μm/min.

Subsequently, this Ge-doped thick GaN film was sliced parallel to the c-plane, and the Ga-polar surface of the thus obtained wafer was subjected to planarization by grinding and subsequent CMP finishing. Slice damages on the N-polar surface side of the wafer were removed by etching. Further, the wafer was cut to complete the production of a Ge-doped c-plane GaN wafer (hereinafter, also referred to as "sample E-1") having a thickness of 335 μm and a main surface area of about 7 $cm^2$.

(3) Evaluations

<(004) XRD Rocking Curve FWHM>

The (004) XRD rocking curve of the sample E-1 was measured at a position away from the edge on the Ga-polar surface.

In the measurement, a line-focus Cukα radiation source provided on an X-ray diffraction apparatus [PANALYTICAL X'Pert Pro MRD, manufactured by Spectris Co., Ltd.] was operated at 45 kV and 40 mA, and Cukor radiation was obtained using a Ge (440) 4-crystal symmetrical monochromator. A parallel optical system was used, and a ½ slit, an X-ray mirror, and a 1 mm (width)×1 mm (height) cross-slit were used on the incident side. As a detector, a semiconductor pixel detector PIXcel$^{3D}$ (registered trademark) was used in the OD mode. The angle resolution was 5 to 6 arcsec.

The X-ray beam size was set such that, when the angle of incidence was 90°, i.e. when an X-ray was allowed to enter perpendicular to a Ga-polar surface of a sample substrate, the irradiated area on the Ga-polar surface had a size of 5 mm in the direction parallel to the ω-axis and 1 mm in the direction perpendicular to the ω-axis.

In the rocking curve measurement, an X-ray was allowed to enter the sample from the direction perpendicular to the a-axis of the GaN crystal. In other words, the incident plane of the X-ray was parallel to the a-plane of the GaN crystal. The FWHM of the thus obtained (004) XRD rocking curve was 8.5 arcsec.

<Electrical Characteristics>

The room-temperature resistivity of the sample E-1, and the carrier concentration and the carrier mobility at room temperature that were determined by hole measurement were 0.012 Ω·cm, $1.5\times10^{18}$ $cm^{-3}$, and 347 $cm^2/V\cdot s$, respectively.

<Impurity Concentrations>

When the impurity concentrations of the sample E-1 were measured by dynamic SIMS, the Ge concentration, the Si concentration, and the O concentration were found to be $1.4\times10^{18}$ atoms/$cm^3$, $7.0\times10^{17}$ atoms/$cm^3$, and $6.8\times10^{15}$ atoms/$cm^3$, respectively, and the concentrations of H, Cl and C were below the lower detection limits.

The lower detection limit concentrations in this SIMS measurement were $1\times10^{15}$ atoms/$cm^3$, $5\times10^{14}$ atoms/$cm^3$, $4\times10^{15}$ atoms/$cm^3$, $2\times10^{16}$ atoms/$cm^3$, $1\times 10^{14}$ atoms/$cm^3$, and $3\times10^{15}$ atoms/$cm^3$ for Ge, Si, O, H (hydrogen), Cl (chlorine), and C (carbon), respectively.

4.2. Experiment 2

As a seed, a c-plane GaN wafer having a Ga-polar surface area of about 6 $cm^2$ and a thickness of 0.4 mm, whose crystal quality was equivalent to that of the second c-plane GaN wafer produced in Experiment 1, was prepared from a GaN crystal grown by an ammonothermal method using $NH_4F$ and $NH_4I$ as mineralizers. On the Ga-polar surface of this seed, a thick GaN film was grown by HVPE using the same vapor-phase growth apparatus as the one used in Experiment 1. The procedures were generally as follows.

First, the seed was set on the susceptor of the vapor-phase growth apparatus. An edge cover was not used.

Next, while supplying $N_2$, $H_2$ and $NH_3$ into the reactor such that their partial pressures were 0.67 atom, 0.31 atom and 0.02 atom, respectively, the inside of the reactor was heated using heaters arranged on the outside of the reactor.

After the susceptor temperature reached 1,000° C., the susceptor temperature was maintained constant to allow GaN to grow. The temperature of the Ga reservoir was set at 900° C. The carrier gas supplied into the reactor during the growth contained 69% of $H_2$ in terms of molar ratio, and the remainder was $N_2$.

During a period of 60 minutes immediately after the start of the growth, GaCl and $NH_3$ were supplied into the reactor to partial pressures of $7.9\times10^{-3}$ atm and $2.4\times10^{-2}$ atm, respectively, and no doping gas was intentionally supplied.

Supply of $SiH_2Cl_2$ into the reactor was initiated 60 minutes after the start of the growth. The supply rate of $SiH_2Cl_2$ was gradually increased over a period of 5 minutes.

Once the supply rate of $SiH_2Cl_2$ reached a prescribed value, GaCl, $NH_3$ and $SiH_2Cl_2$ were supplied into the reactor such that their partial pressures were $7.9\times10^{-3}$ atm, $2.4\times10^{-2}$ atm and $1.9\times10^{-8}$ atm, respectively, whereby a Si-doped thick GaN film was grown to about 2.38 mm.

From the thickness and the growth time, the growth rate of the Si-doped thick GaN film was calculated to be 40 μm/h.

Subsequently, this Si-doped thick GaN film was sliced parallel to the c-plane, and the Ga-polar surface of the thus obtained wafer was subjected to planarization by grinding and subsequent CMP finishing. Slice damages on the N-polar surface side of the wafer were removed by etching. Further, the wafer was cut to complete the production of a Si-doped c-plane GaN wafer (hereinafter, also referred to as "sample E-2") having a thickness of 335 μm and a main surface area of about 6 $cm^2$.

As a result of measuring the (004) XRD rocking curve of the sample E-2 at a position away from the edge on the Ga-polar surface in the same manner as in Experiment 1, the FWHM thereof was 10.0 arcsec.

The room-temperature resistivity of the sample E-2, and the carrier concentration and the carrier mobility at room temperature that were determined by hole measurement were 0.013 Ω·cm, $1.3\times10^{18}$ $cm^{-3}$, and 391 $cm^2/V\cdot s$, respectively.

When the impurity concentrations of the sample E-2 were measured by dynamic SIMS, the Si concentration was found to be $1.4\times10^{18}$ atoms/$cm^3$, and the concentrations of O (oxygen), H (hydrogen), C1 (chlorine) and C (carbon) were below the lower detection limits. The lower detection limit concentrations in this SIMS measurement were $5\times10^{14}$ atoms/$cm^3$, $4\times10^{15}$ atoms/$cm^3$, $2\times10^{16}$ atoms/$cm^3$, $1\times10^{14}$ atoms/$cm^3$, and $3\times10^{15}$ atoms/$cm^3$ for Si, O, H, Cl, and C, respectively.

In the sample E-2, the total concentration of donor impurities excluding Si was less than 1% of the Si concentration, and the carrier concentration was 93% of the Si concentration.

4.3. Experiment 3

As a seed, a c-plane GaN wafer having a Ga-polar surface area of about 33 $cm^2$ and a thickness of 0.4 mm, whose crystal quality was equivalent to that of the second c-plane GaN wafer produced in Experiment 1, was prepared from a GaN crystal grown by an ammonothermal method using $NH_4F$ and $NH_4I$ as mineralizers. On the Ga-polar surface of this seed, a thick GaN film was grown by HVPE using the same vapor-phase growth apparatus as the one used in Experiment 1. The procedures were generally as follows.

First, the seed was set on the susceptor of the vapor-phase growth apparatus, and the periphery of the seed was surrounded by a graphite edge cover having a height of 6 mm. The edge cover was brought into tight contact with the edge of the seed.

Next, while supplying $N_2$, $H_2$ and $NH_3$ into the reactor such that their partial pressures were 0.73 atom, 0.24 atom and 0.024 atom, respectively, the inside of the reactor was heated using heaters arranged on the outside of the reactor.

After the susceptor temperature reached 1,000° C., the susceptor temperature was maintained constant to allow GaN to grow. The temperature of a Ga reservoir boat was set at 900° C. The carrier gas supplied into the reactor during the growth contained 75% of $H_2$ in terms of molar ratio, and the remainder was $N_2$.

During a period of 60 minutes immediately after the start of the growth, GaCl and $NH_3$ were supplied into the reactor to partial pressures of $7.9\times10^{-3}$ atm and $2.4\times10^{-2}$ atm, respectively, and no doping gas was intentionally supplied.

Supply of $SiH_2Cl_2$ into the reactor was initiated 60 minutes after the start of the growth. The supply rate of $SiH_2Cl_2$ was gradually increased over a period of 5 minutes. Once the supply rate of $SiH_2Cl_2$ reached a prescribed value, GaCl, $NH_3$ and $SiH_2Cl_2$ were supplied into the reactor such that their partial pressures were $7.9\times10^{-3}$ atm, $2.4\times10^{-2}$ atm and $1.6\times10^{-3}$ atm, respectively, whereby a Si-doped thick GaN film was grown to about 2 mm.

From the thickness and the growth time, the growth rate of the Si-doped thick GaN film was calculated to be 35 μm/h.

Subsequently, the thus grown thick GaN film was sliced parallel to the c-plane, and the Ga-polar surface of the thus obtained wafer was subjected to planarization by grinding and subsequent CMP finishing. Slice damages on the N-polar surface side of the wafer were removed by etching. Further, the wafer was cut to complete the production of a Si-doped c-plane GaN substrate (hereinafter, also referred to as "sample E-3") having a thickness of 360 μm and a main surface area of about 30 $cm^2$.

The (004) XRD rocking curve of the sample E-3 was measured on the Ga-polar surface side.

First, a ω-scan was performed at 1-mm intervals over a length of 40 mm along a single line extending perpendicular to the m-axis substantially through the center of the Ga-polar surface, whereby a (004) XRD rocking curve was obtained at 40 measurement points aligned at a pitch of 1 mm on the line. The measurement conditions at each measurement point were the same as in Experiment 1, except that the X-ray was allowed to enter the sample from the direction perpendicular to the m-axis of the GaN crystal.

The maximum value and the average value of the (004) XRD rocking curve FWHM among the 40 measurement points was 19.3 arcsec and 10.5 arcsec, respectively.

Next, a ω-scan was performed at 1-mm intervals over a length of 40 mm along a single line extending perpendicular to the a-axis substantially through the center of the Ga-polar surface, whereby a (004) XRD rocking curve was obtained at 40 measurement points aligned at a pitch of 1 mm on the line. The measurement conditions at each measurement point were the same as in Experiment 1.

The maximum value and the average value of the (004) XRD rocking curve FWHM among the 40 measurement points was 16.2 arcsec and 10.4 arcsec, respectively.

The carrier concentration of the sample E-3 measured at the center of the Ga-polar surface was $1.5\times10^{18}$ $cm^{-3}$.

4.4. Experiment 4

As a seed, a c-plane GaN wafer having a Ga-polar surface area of about 32 $cm^2$ and a thickness of 0.56 mm, whose crystal quality was equivalent to that of the second c-plane GaN wafer produced in Experiment 1, was prepared from a GaN crystal grown by an ammonothermal method using $NH_4F$ and $NH_4I$ as mineralizers. On the Ga-polar surface of this seed, a thick GaN film was grown by HVPE using the same vapor-phase growth apparatus as the one used in Experiment 1. The procedures were generally as follows.

First, the seed was set on the susceptor of the vapor-phase growth apparatus, and the edge of the seed and the outer periphery of the Ga-polar surface were covered with a graphite edge cover having a height of 4 mm.

Next, while supplying $N_2$, $H_2$ and $NH_3$ into the reactor such that their partial pressures were 0.30 atom, 0.65 atom and 0.052 atom, respectively, the inside of the reactor was heated using heaters arranged on the outside of the reactor. Once the susceptor temperature reached 960° C., the growth of GaN was started. Supply of $SiH_2Cl_2$ into the reactor was initiated 10 minutes after the start of the growth. The supply rate of $SiH_2Cl_2$ was gradually increased over a period of 30 minutes.

As for the growth conditions during a period of from the start of the growth to 3 hours thereafter, the gallium reservoir temperature, the susceptor temperature, the GaCl partial pressure, the $NH_3$ partial pressure and the $SiH_2Cl_2$ partial pressure were 800° C., 960° C., $6.0\times10^{-3}$ atm, $4.1\times10^{2}$ atm and $2.1\times10^{-8}$ atm, respectively. After a lapse of 3 hours, the susceptor temperature was raised to 998° C. The carrier gas supplied into the reactor contained 40% of $H_2$ in terms of molar ratio, and the remainder was $N_2$.

In this manner, a Si-doped thick GaN film was grown to a thickness of about 2.2 mm. The growth rate was 37 μm/h.

Subsequently, the thus grown thick GaN film was sliced parallel to the c-plane, and the Ga-polar surface of the thus obtained wafer was subjected to planarization by grinding and subsequent CMP finishing. Slice damages on the N-polar surface side of the wafer were removed by etching. Further, the wafer was cut to complete the production of a c-plane GaN wafer (hereinafter, also referred to as "sample E-4") having a thickness of 400 μm and a main surface area of about 16 $cm^2$.

The (004) XRD rocking curve of the sample E-4 was measured on the Ga-polar surface side.

A ω-scan was performed at 1-mm intervals over a length of 40 mm along a single line extending perpendicular to the m-axis through the center of the Ga-polar surface, whereby a (004) XRD rocking curve was obtained at 40 measurement points aligned at a pitch of 1 mm on the line. The measurement conditions at each measurement point were the same as in Experiment 1, except that the X-ray was allowed to enter the sample from the direction perpendicular to the m-axis of the GaN crystal.

The maximum value and the average value of the (004) XRD rocking curve FWHM among the 40 measurement points was 17.8 arcsec and 11.2 arcsec, respectively.

The carrier concentration of the sample E-4 measured at the center of the Ga-polar surface was $1.5\times10^{18}$ $cm^{-3}$.

It was also possible to grow a c-plane GaN substrate, which had an equivalent crystal quality as the sample E-4 and a carrier concentration of $2.8\times10^{18}$ $cm^{-3}$ in the center of the Ga-polar surface, using substantially the same conditions as in the growth of the sample E-4, except that the supply amount of $SiH_2Cl_2$ was increased.

4.5. Experiment 5

As a seed, a c-plane GaN wafer having a Ga-polar surface area of about 33.8 $cm^2$ and a thickness of 0.55 mm, whose crystal quality was equivalent to that of the second c-plane GaN wafer produced in Experiment 1, was prepared from a GaN crystal grown by an ammonothermal method using $NH_4F$ and $NH_4I$ as mineralizers. On the Ga-polar surface of this seed, a thick GaN film was grown by HVPE using the same vapor-phase growth apparatus as the one used in Experiment 1. The procedures were generally as follows.

First, the seed was set on the susceptor of the vapor-phase growth apparatus, and the edge of the seed and the outer periphery of the Ga-polar surface were covered with a graphite edge cover having a height of 4 mm.

Next, while supplying $N_2$, $H_2$ and $NH_3$ into the reactor such that their partial pressures were 0.30 atom, 0.65 atom and 0.052 atom, respectively, the inside of the reactor was heated using heaters arranged on the outside of the reactor.

Once the susceptor temperature reached 1,005° C., the growth of GaN was started. As for the growth conditions, the gallium reservoir temperature, the susceptor temperature, the GaCl partial pressure and the $NH_3$ partial pressure were set at 800° C., 1,005° C., $9.0\times10^{-3}$ atm and $4.1\times10^{-2}$ atm, respectively. The carrier gas supplied into the reactor contained 38% of $H_2$ in terms of molar ratio, and the remainder was $N_2$.

Further, supply of $GeCl_4$ into the reactor was initiated 5 hours after the start of the growth. The $GeCl_4$ partial pressure was gradually increased to $1.9\times10^{-7}$ atm over a period of 30 minutes, and maintained constant thereafter.

In this manner, a Ge-doped thick GaN film was grown to a thickness of about 3 mm. The growth rate was 47 μm/h.

Subsequently, the thus grown thick GaN film was sliced parallel to the c-plane, and the Ga-polar surface of the thus obtained wafer was subjected to planarization by grinding and subsequent CMP finishing. Slice damages on the N-polar surface side of the wafer were removed by etching. Further, the wafer was cut to complete the production of a c-plane GaN wafer (hereinafter, also referred to as "sample E-5") having a thickness of 400 μm and a main surface area of about 19.5 $cm^2$.

The (004) XRD rocking curve of the sample E-5 was measured on the Ga-polar surface side.

First, a ω-scan was performed at 1-mm intervals over a length of 40 mm along a single line extending perpendicular to the m-axis through the center of the Ga-polar surface, whereby a (004) XRD rocking curve was obtained at 40 measurement points aligned at a pitch of 1 mm on the line. The measurement conditions at each measurement point were the same as in Experiment 1, except that the X-ray was allowed to enter the sample from the direction perpendicular to the m-axis of the GaN crystal.

The maximum value and the average value of the (004) XRD rocking curve FWHM among the 40 measurement points was 9.4 arcsec and 7.5 arcsec, respectively.

Next, a ω-scan was performed at 1-mm intervals over a length of 40 mm along a single line extending perpendicular to the a-axis substantially through the center of the Ga-polar surface, whereby a (004) XRD rocking curve was obtained at 40 measurement points aligned at a pitch of 1 mm on the line. The measurement conditions at each measurement point were the same as in Experiment 1.

The maximum value and the average value of the (004) XRD rocking curve FWHM among the 40 measurement points was 11.0 arcsec and 7.9 arcsec, respectively.

The carrier concentration of the sample E-5 measured at the center of the Ga-polar surface was $4.9\times10^{18}$ $cm^{-3}$.

Further, using a PL (photoluminescence) imaging apparatus [PLI-200, manufactured by PHOTON Design Corporation], the number of dark spots observed in a square area of 230 μm×230 μm on a PL image was counted at plural measurement points on the Ga-polar surface of the sample E-5. The PL image was obtained using a mercury lamp as an excitation source at an excitation wavelength of 313 nm and a detection wavelength of 365±5 nm. Since a 2,048×2,048 pixel CMOS camera was used as a detector, the pixel resolution was about 0.11 μm.

The plural measurement points were positioned at the lattice points of a square lattice of 2.88 mm on a side, and the number thereof was 381.

The average dark spot density among the 381 measurement points was $3.3\times10^{4}$ $cm^{-2}$, and the number of measurement points not observed with a dark spot was 54% of all measurement points. For the calculation of the average value, the dark spot density at those measurement points not observed with a dark spot was defined as 0 $cm^{-2}$, and the dislocation density at those measurement points observed with only one dark spot was taken as $1.9\times10^{3}$ $cm^{-2}$ since there was one dark spot per 230×230 $\mu m^2$.

After the above-described measurement of the dark spot density by PL imaging, when the sample E-5 was etched for 1 hour with 89%-concentration sulfuric acid heated to 270° C., etch pits formed on the Ga-polar surface had one-to-one correspondence with the dark spots of the PL image. The present inventors have separately confirmed that etch pits formed by this method also have one-to-one correspondence with dark spots appearing on a cathode luminescence image.

For a c-plane GaN wafer having a thickness of 400 μm and a main surface area of about 20 $cm^2$, which was sliced simultaneously with the sample E-5 from the above-described Ge-doped thick GaN film of about 3 mm in thickness and completed through the same process as the sample E-5, the variation in the off-cut angle in a main surface was checked. When a direction parallel to one of the a-planes was selected as x-direction and the direction perpendicular to the x-direction was defined as y-direction, the variation width of the x-direction component of the off-cut angle was 0.04° (±0.02° from a median value) on a 4-cm line extending in the x-direction through the center of the Ga-polar surface, and the variation width of the y-direction component of the off-cut angle was 0.06° (±0.03° from a median value) on a 4-cm line extending in the y-direction through the center of the Ga-polar surface.

4.6. Experiment 6

As a seed, a c-plane GaN wafer whose crystal quality was equivalent to that of the second c-plane GaN wafer produced in Experiment 1 was prepared from a GaN crystal grown by an ammonothermal method using $NH_4F$ and $NH_4I$ as mineralizers. On the Ga-polar main surface of this seed, a GaN crystal was grown by HVPE under different conditions using the same vapor-phase growth apparatus as the one used in Experiment 1, whereby samples E-6a to E-6e were each produced.

During the growth of the GaN crystal by HVPE, the susceptor temperature and the Ga reservoir temperature were set at about 1,000° C. and 800° C., respectively, and the carrier gas supplied into the reactor contained 69% of $H_2$ in terms of molar ratio, and the remainder was $N_2$.

For all of the samples E-6a to E-6e, the first layer grown first on the seed was formed at a growth rate of about 40 μm/h.

The sample E-6a was obtained by growing only the first layer on the seed.

The sample E-6b was produced by growing the first layer and subsequently growing a second layer of 40 μm in thickness at a growth rate of 80 μm/h.

The sample E-6c was produced by growing the first layer and subsequently growing a second layer of 40 μm in thickness at a growth rate of 120 μm/h.

The sample E-6d was produced by growing the first layer and subsequently growing a Si-doped second layer of 21 μm in thickness using $SiH_2Cl_2$ (dichlorosilane).

The sample E-6e was produced by growing the first layer and subsequently growing a Ge-doped second layer of 21 μm in thickness using $GeCl_4$ (tetrachlorogermane).

The growth conditions of a GaN crystal by HVPE in the production of these samples were as shown in Table 2 below.

TABLE 2

| | | Grouwh condition of GaN crystal by HVPE | | | | |
|---|---|---|---|---|---|---|
| | Item | Sample E-6a | Sample E-6b | Sample E-6c | Sample E-6d | Sample E-6e |
| First layer | GaCl partial pressure (atm) | $7.9 \times 10^{-3}$ | $7.9 \times 10^{-3}$ | $7.9 \times 10^{-3}$ | $7.9 \times 10^{-3}$ | $7.9 \times 10^{-3}$ |
| | $NH_3$ partial pressure (atm) | $2.4 \times 10^{-2}$ | $2.4 \times 10^{-2}$ | $2.4 \times 10^{-2}$ | $2.4 \times 10^{-2}$ | $2.4 \times 10^{-2}$ |
| | $H_2$ molar ratio in carrier gas | 69% | 69% | 69% | 69% | 69% |
| | Doping gus | — | — | — | — | — |
| | Growth rate (μm/h) | 40 | 40 | 40 | 44 | 44 |
| | Growth thickness (μm) | 40 | 40 | 40 | 40 | 40 |
| Second layer | GaCl partial pressure (atm) | — | $1.1 \times 10^{-2}$ | $1.3 \times 10^{-2}$ | $7.9 \times 10^{-3}$ | $7.9 \times 10^{-3}$ |
| | $NH_3$ partial pressure (atm) | — | $3.3 \times 10^{-2}$ | $4.0 \times 10^{-2}$ | $2.4 \times 10^{-2}$ | $2.4 \times 10^{-2}$ |
| | $H_2$ molar ratio in carrier gas | — | 69% | 69% | 69% | 69% |
| | Doping gus | — | — | — | $SiH_2Cl_2$ | $GeCl_4$ |
| | Growth rate (μm/h) | — | 80 | 120 | 40 | 40 |
| | Growth thickness (μm) | — | 40 | 40 | 21 | 21 |

In all of the samples E-6a to E-6e, the GaN crystal grown by HVPE on the seed was observed with naked eyes to have a mirror-finished flat upper surface.

When cross-sections of the samples E-6d and E-6e were each observed under a fluorescence microscope, the interface between the first layer and the second layer had a good flatness.

In both of the samples E-6d and E-6e, the carrier concentration of the second layer was $1\times10^{18}$ $cm^{-3}$ as evaluated by Raman spectroscopy.

Figure 14:
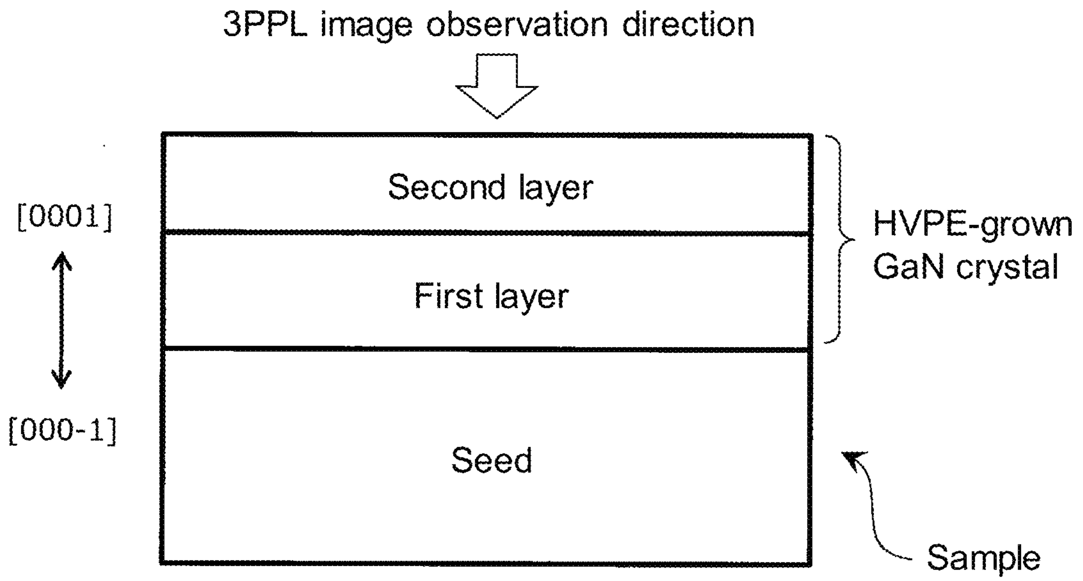
FIG. 14 is a drawing that illustrates the constitution of the sample produced in Experiment 6, and the direction of observing a three-photon excitation image in Experiment 6.

Under a multiphoton excitation microscope (high-speed multiphoton confocal laser microscope system A1R-MP+, manufactured by Nikon Corporation), three-photon excitation images (3PPL images) of the respective samples E-6a to E-6e were observed from the surface side of the HVPE-GaN crystal as illustrated in FIG. 14 (it is noted here that the sample E-6a did not have the second layer). A Ti-sapphire mode-locked laser having a wavelength of 800 nm was used as an excitation source, and this was operated at a pulse width of 140 fs and a repetition frequency of 80 MHZ.

The followings were found from the observation of the 3PPL images.

The threading dislocations existing in the first layer of the sample E-6a all propagated from the seed. Generation of new threading dislocations was observed neither at the interface between the seed and the first layer nor in the middle of the first layer.

In the sample E-6b, the threading dislocations of the first layer propagated to the second layer without branching at the interface between the first layer and the second layer. Generation of new threading dislocation was not observed in the middle of the second layer.

In the sample E-6c, differently from the sample E-6b, all of the threading dislocations propagating from the first layer to the second layer branched into two at the interface between the first layer and the second layer. In other words, the number of the threading dislocation in the second layer was twice as large as that in the first layer.

In the sample E-6d, some of the threading dislocations branched into two at the interface between the first layer and the second layer in the process of propagating from the first layer to the second layer; however, the ratio of such threading dislocations was merely in the order of one in one hundred. Generation of new threading dislocation was not observed in the middle of the second layer.

In the sample E-6e as well, some of the threading dislocations branched into two at the interface between the first layer and the second layer in the process of propagating from the first layer to the second layer; however, the ratio of such threading dislocations was merely in the order of one in fifty. Generation of new threading dislocation was not observed in the middle of the second layer.

These 3PPL observation results of the samples E-6d and E-6e suggest that doping with Si or Ge has hardly any effect on the threading dislocation density.

4.7. Experiment 7

As a seed, a c-plane GaN wafer having a Ga-polar surface area of about 24.8 $cm^2$ and a thickness of 0.53 mm, whose crystal quality was equivalent to that of the second c-plane GaN wafer produced in Experiment 1, was prepared from a GaN crystal grown by an ammonothermal method using $NH_4F$ and $NH_4I$ as mineralizers. In the production process of this GaN crystal, a selective growth mask having a square lattice pattern with inclined linear openings of 20 μm in line width was used. The inclined square lattice pattern was obtained by superimposing two stripe patterns that were each parallel to the a-plane and formed an angle of 60° with each other, and one of these two stripe patterns had a pitch of 2 mm while the other had a pitch of 15 mm.

On the Ga-polar surface of the thus prepared seed, a thick GaN film was grown by HVPE using the same vapor-phase growth apparatus as the one used in Experiment 1. The procedures were generally as follows.

First, the seed was set on the susceptor of the vapor-phase growth apparatus, and the edge of the seed and the outer periphery of the Ga-polar surface were covered with a graphite edge cover having a height of 4 mm.

Next, while supplying $N_2$, $H_2$ and $NH_3$ into the reactor such that their partial pressures were 0.30 atom, 0.65 atom and 0.052 atom, respectively, the inside of the reactor was heated using heaters arranged on the outside of the reactor. Once the susceptor temperature reached 1,005° C., the growth of GaN was started. As for the growth conditions, the gallium reservoir temperature, the susceptor temperature, the GaCl partial pressure and the $NH_3$ partial pressure were set at 800° C., 1,005° C., $9.2\times10^{-3}$ atm and $4.2\times10^{-2}$ atm, respectively. The carrier gas supplied into the reactor contained 40% of $H_2$ in terms of molar ratio, and the remainder was $N_2$.

Further, supply of $GeCl_4$ into the reactor was initiated 5 hours after the start of the growth. The $GeCl_4$ partial pressure was gradually increased to $1.6\times10^{-7}$ atm over a period of 30 minutes, and maintained constant thereafter. In addition, after a lapse of 5 hours from the start of the growth, the GaCl partial pressure was gradually increased to $9.4\times10^{-3}$ atm over a period of 4 hours.

In this manner, a Ge-doped thick GaN film was grown to a thickness of about 3 mm. The growth rate was 43 μm/h.

Subsequently, the thus grown thick GaN film was sliced parallel to the c-plane, and the main surface of the thus obtained wafer was subjected to planarization by grinding and subsequent CMP finishing. Further, the wafer was cut to complete the production of a c-plane GaN wafer (hereinafter, also referred to as "sample E-7") having a thickness of 400 μm and a main surface area of about 15.2 $cm^2$.

The carrier concentration of the sample E-7 measured at the center of the Ga-polar surface was $2.0\times10^{18}$ $cm^{-3}$.

Figure 16:
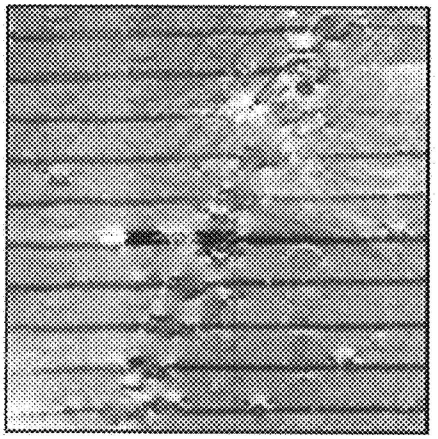
FIG. 16 is a transmission X-ray topographic image (drawing substitute) having a square area of 20 mm×20 mm, which was obtained in Experiment 7 from a c-plane GaN wafer (sample E-7) composed of a GaN crystal grown by HVPE.

An X-ray topography analysis of the sample E-7 was performed using an X-ray diffraction apparatus [High-Throughput & High-Resolution X-ray Topography Imaging System XRTmicron, manufactured by Rigaku Corporation]. FIG. 16 shows a transmission X-ray topographic image having a square area of 20 mm×20 mm that was obtained utilizing diffraction from the (110) crystal plane. Since MoKα was used as an X-ray source and the sample had a thickness of 400 μm, the value of μ·t was 11.6 (μ·t=11.6). Accordingly, this X-ray topographic image is an anomalous transmission image.

There is a previous case where an X-ray anomalous transmission image was observed in an m-plane GaN wafer composed of a GaN crystal grown by HVPE (WO2015/020161); however, the present application appears to be the first report on X-ray anomalous transmission in a c-plane GaN wafer grown by HVPE.

Referring to FIG. 16, stripes formed by defect arrays extending along the lateral direction in the image as well as defect regions extending from the lower left to the upper right, which are inclined at 60° with respect to the stripes, are observed. The stripes are parallel to the a-plane and have a pitch of 2 mm, reflecting the pattern of the selective growth mask used in the production process of the c-plane GaN wafer used as a seed.

A transmission X-ray topographic image having a square area of 20 mm×20 mm was also obtained for a 350 μm-thick c-plane GaN wafer that was produced by substantially the same method, except that the dopant was changed from Ge to Si.

The present invention has been described based on concrete embodiments; however, these embodiments were presented as examples, and should not limit the scope of the present invention. The embodiments described herein can each be variously modified without departing from the spirit of the present invention and, where feasible, may be combined with any feature described by another embodiment.

DESCRIPTION OF SYMBOLS

10: crystal
11, 21: first main surface
12, 22: second main surface
20: wafer
40: bilayer wafer
43: regrowth interface
100: HVPE apparatus
101: reactor
102: gallium reservoir
103: susceptor
104: first heater
105: second heater
$Z_1$: first zone
$Z_2$: second zone
$P_1$: ammonia introduction pipe
$P_2$: hydrogen chloride introduction pipe
$P_3$: gallium chloride introduction pipe
$P_4$: dopant introduction pipe
$P_E$: exhaust pipe

What is claimed is:

1. An n-type GaN crystal, having two main surfaces facing opposite directions from each other, wherein one of the two main surfaces has a Ga polarity and is inclined at an angle of 0° to 10° with respect to a (0001) crystal plane, and the n-type GaN crystal yields at least one X-ray anomalous transmission image having a square area of 10 mm×10 mm, and satisfies at least one condition of the following (a) to (c) regarding impurity concentrations:

(a) a concentration of Si is $5\times10^{16}$ atoms/$cm^3$ or higher;

(b) a concentration of 0 is $3\times10^{16}$ atoms/$cm^3$ or lower; and (c) a concentration of H is $1\times10^{17}$ atoms/$cm^3$ or lower.

2. The n-type GaN crystal according to claim 1, having a room-temperature resistivity of lower than 0.03 Ω·cm or a carrier concentration of $1\times10^{18}$ $cm^{-3}$ or higher.

3. The n-type GaN crystal according to claim 2, wherein a Ge concentration is $1\times10^{18}$ atoms/$cm^3$ or higher, and the Si concentration is $4\times10^{17}$ atoms/$cm^3$ or higher.

4. The n-type GaN crystal according to claim 2, wherein a donor impurity contained at the highest concentration is Ge.

5. The n-type GaN crystal according to claim 4, wherein concentration of each impurity excluding Ge, Si, O and His $5\times10^{15}$ atoms/$cm^3$ or lower.

6. The n-type GaN crystal according to claim 2, wherein a donor impurity contained at the highest concentration is Si.

7. The n-type GaN crystal according to claim 6, wherein concentration of each impurity excluding Si, O and H is $5\times10^{15}$ atoms/$cm^3$ or lower.

8. The n-type GaN crystal according to claim 6, wherein a total concentration of donor impurities excluding Si is 10% or less of the Si concentration.

9. The n-type GaN crystal according to claim 8, wherein the carrier concentration is 90% or more of the Si concentration.

10. A method of producing an epitaxial wafer, the method comprising:

preparing the n-type GaN crystal according claim 1; and epitaxially growing at least one nitride semiconductor layer on the n-type GaN crystal.

11. An epitaxial wafer, comprising:

the n-type GaN crystal according to claim 1; and at least one nitride semiconductor layer epitaxially grown on the n-type GaN crystal.

12. A method of producing a nitride semiconductor device, the method comprising:

preparing the n-type GaN crystal according to claim 1; and epitaxially growing at least one nitride semiconductor layer on the n-type GaN crystal.

13. A method of producing a bilayer GaN wafer, the method comprising:

preparing a GaN wafer, which is the n-type GaN crystal according to claim 1; and epitaxially growing a GaN layer having a thickness of 20 μm or larger on the main surface of the Ga-polar side of the GaN wafer, wherein a high-carrier-concentration region or a carrier compensation region is formed on the GaN layer, the high-carrier-concentration region is a region in which carrier concentration is $1\times10^{18}$ $cm^{-3}$ or higher, and the carrier compensation region is a region in which a total concentration of compensating impurities is $2\times10^{17}$ $atoms/cm^3$ or higher.

14. The method according to claim 13, wherein the GaN layer is epitaxially grown on the GaN wafer by HVPE.

15. The method according to claim 13, wherein the GaN layer has a thickness of 500 μm or less.

16. The method according to claim 13, wherein the high-carrier-concentration region is formed on the GaN layer.

17. The method according to claim 16, wherein the high-carrier-concentration region is doped with Ge.

18. The method according to claim 16, wherein the high-carrier-concentration region is intentionally doped with Si.

19. The method according to claim 13, wherein the carrier compensation region is formed on the GaN layer.

20. A method of producing a bulk GaN crystal, the method comprising:

preparing a GaN wafer, which is the n-type GaN crystal according to claim 1; and epitaxially growing GaN on the GaN wafer.

* * * * *